United States Patent [19]

Vinal

[11] 4,129,880
[45] Dec. 12, 1978

[54] CHANNEL DEPLETION BOUNDARY MODULATION MAGNETIC FIELD SENSOR

[75] Inventor: Albert W. Vinal, Cary, N.C.

[73] Assignee: International Business Machines Incorporated, Armonk, N.Y.

[21] Appl. No.: 812,298

[22] Filed: Jul. 1, 1977

[51] Int. Cl.$^2$ ............... H01L 27/22; H01L 29/82; H01L 29/96

[52] U.S. Cl. ............................ 357/27; 307/309; 357/23

[58] Field of Search .................... 357/27, 23; 307/309

[56] References Cited

U.S. PATENT DOCUMENTS

| | | | |
|---|---|---|---|
| 3,994,010 | 11/1976 | Geske | 357/27 |
| 3,997,909 | 12/1976 | Vinal | 357/27 |
| 4,048,648 | 9/1977 | Vinal | 357/27 |

FOREIGN PATENT DOCUMENTS

| | | | |
|---|---|---|---|
| 51550 | 2/1972 | Japan | 357/27 |
| 51551 | 2/1972 | Japan | 357/27 |

OTHER PUBLICATIONS

IBM Technical Disclosure Bulletin; by Freeman, vol. 18, No. 5, Oct. 1975, p. 1389.
The Magfet; The 22 Southwestern IEEE Conference Paper by Carr et al., pp. 166-170, Apr. 1970.

*Primary Examiner*—Andrew J. James
*Attorney, Agent, or Firm*—Edward H. Duffield

[57] ABSTRACT

A high sensitivity, low noise, broad bandwidth channel conduction field sensor device is described. The conductive channel is configured to create an exceptionally narrow, undepleted conduction channel of approximately filamentary form. The filamentary conductive channel so formed is provided with a source at one end of the channel and two or more laterally spaced drains at the other end thereof. Electric or magnetic fields may be utilized to deflect a stream of charge carriers traversing the conductive channel from the source toward the drains utilizing the depletion width modulation effect of the fields upon the boundaries defining the conductive channel portion. Modulation of the depletion zone width and depth along the channel sides effectively moves the stream of carriers and the conductive channel area to overlap one drain more than another. This develops a differential drain current balance which can be utilized to provide an output signal. Width and length criteria for defining a filamentary channel structure are described for the ultimate desired configuration and size which are to be obtained. As noted, operation of the device is based upon modulation of the width and depth of the depletion zone boundaries defining the conductive channel. An increased signal output is obtained by reducing the width of the channel to eliminate excess carriers normally found in wide channel devices and, further, by making the depletion zones as large a portion of the total channel width as can be obtained.

10 Claims, 30 Drawing Figures

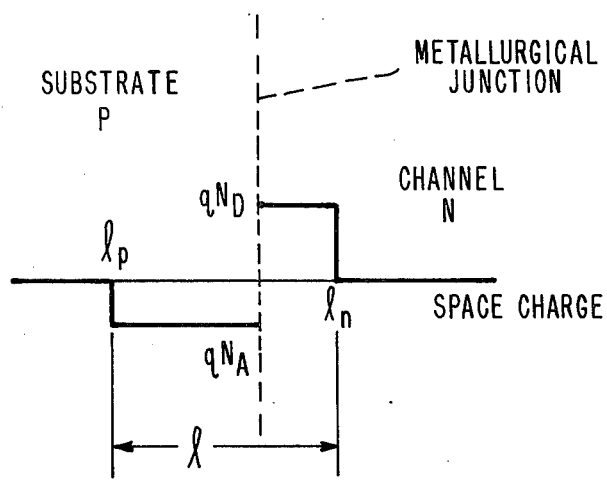

FIG. 10A

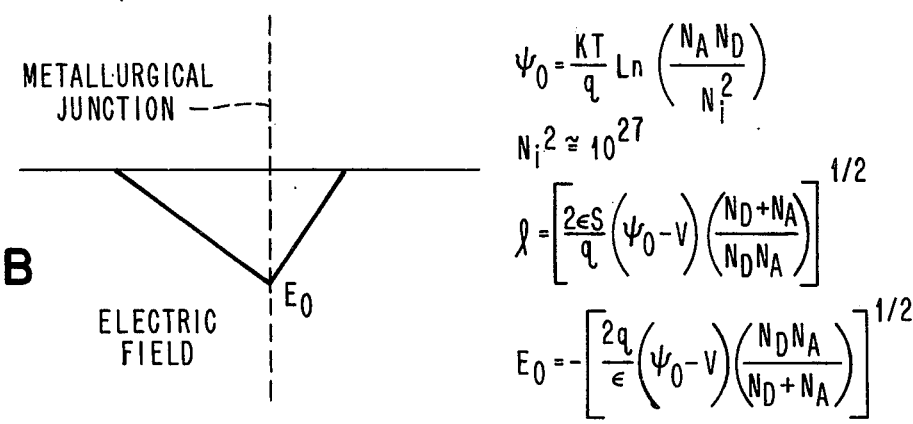

FIG. 10B $$\psi_0 = \frac{KT}{q} \ln\left(\frac{N_A N_D}{N_i^2}\right)$$

$$N_i^2 \cong 10^{27}$$

$$\ell = \left[\frac{2\epsilon S}{q}(\psi_0 - V)\left(\frac{N_D + N_A}{N_D N_A}\right)\right]^{1/2}$$

$$E_0 = -\left[\frac{2q}{\epsilon}(\psi_0 - V)\left(\frac{N_D N_A}{N_D + N_A}\right)\right]^{1/2}$$

FIG. 10C

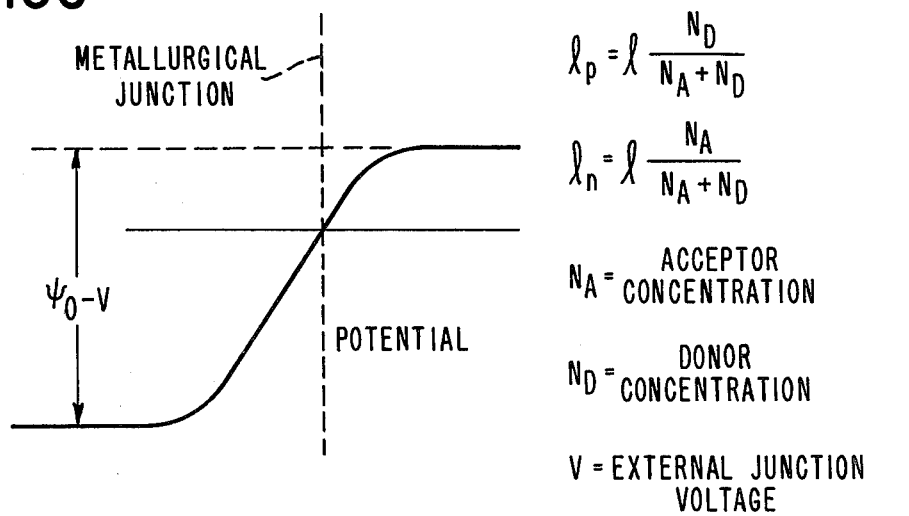

$$\ell_p = \ell \frac{N_D}{N_A + N_D}$$

$$\ell_n = \ell \frac{N_A}{N_A + N_D}$$

$N_A$ = ACCEPTOR CONCENTRATION $N_D$ = DONOR CONCENTRATION

V = EXTERNAL JUNCTION VOLTAGE

CHANNEL DEPLETION BOUNDARY MODULATION MAGNETIC FIELD SENSOR

BACKGROUND

1. Field of the Invention

This invention relates to field sensors in general and to semiconductive magnetic sensors in the general field effect transistor type in particular.

2. Prior Art

A great amount of effort has been expended in developing field effect transistor magnetic sensor devices. The general operation of the prior art devices has consisted of utilizing what was previously understood to be Lorentz deflection of the carriers flowing between the source and one or more drains in a field effect transistor. This was used to create an imbalance in the drain currents thereof to give a differential signal output at the drains. See, for example, IBM Technical Disclosure Bulletin, Volume 13, No. 12, May 1971, page 3633, or, for example, the U.K. Pat. No. 1,243,178 in which an FET magnetic sensor having two or three drains and a source at opposite ends, respectively, of a field effect transistor channel is shown. As will be understood by those of skill in the art, suitable gate and insulating oxide layers are also formed in such devices to control the flow of current in the channel. In the aforementioned U.K. patent, by application of suitable voltage to the gate an inversion layer acting as a conductive channel is established. The effective conducting channel thus formed, extends between the source and two or three drains. The source is connected to ground and the drains are connected to a supply voltage through resistive loads which may be of equal value. As is well known in the art, when the device is operated with appropriate voltages on the source, on the drain and on the gate, a current will flow between the source and drains. It has been thought that this current stream could be deflected by Lorentz force produced by a magnetic field intersecting the path of the charge carriers. This is the well-known state of the art and, as stated in this U.K. patent, it is believed that the Lorentz deflection force will cause charge to "build up" on one side of the channel and to be depleted on the other side until the electric field produced by the displacement of charge applies a force on the charge carriers which is equal and opposite to that due to the magnetic field.

This classical teaching of a "charge buildup" occurring in the channel to oppose deflection of the charge carriers has resulted in the use of relatively wide channels in the field effect transistor structures of this type. This was to provide room to deflect the charge carriers without interaction or "charge buildup" occurring to a significant degree. Of course, a wider channel will carry proportionately greater currents than narrower channels would have. In the differential mode, only a small number of the current carriers (those near the center of the channel) are actually deflected in their path to strike one drain instead of another. The majority of carriers in the wide channel device will, therefore, add to the drain current at the output drains in a manner which is not affected by Lorentz deflection. This in turn means that noise voltages produced in the load resistors will be greater than would otherwise be the case with a narrow channel device. Furthermore, since only a relatively small proportion of the carriers in the channel are capable of being deflected to produce a signal, the signal levels produced relative to the noise levels produced will be relatively smaller than might be desired. Also, because of the greater relative width of a channel of this type, the resolution of the device, i.e., the narrowest band of magnetic flux which can be utilized to deflect the carriers that produce an output signal will be reduced.

The use of wide channels, i.e., those in which the channel width is greater than the width of the smallest drain or source of spacing of elements, indicates that the width of the depletion zones along the channel boundaries was either ignored or unrecognized in the prior art. In either event, the prior art depletion zones in such wide channel devices constitute an insignificant portion of the prior art channel width. In contrast, in the present invention, the widths of the depletion zones within the channel constitute a significant portion of the total channel width because the channel widths are so small that the depletion zones form a relatively greater portion of the total width.

Related prior art of a slightly different sort uses bipolar (P-N) or junction devices in which the source and one or more drains are of dissimilar conductivity material embedded in a substrate of semiconductive material. See, for example, U.S. Pat. Nos. 3,714,559 and 3,829,883 or 3,167,663 and 3,731,123. As noted in these patents, a major problem associated with magnetic field sensors of the FET type is the difficulty of obtaining high sensitivity with sufficiently large output signals under acceptable signal-to-noise ratios in sufficient bandwidth conditions. In the first mentioned U.S. Pat. Nos. 3,714,559 and 3,829,883, a multi drain FET magnetic field detector is shown which is operated in a mode in which the gate is biased to less than the transistor threshold and the first drain is biased to produce avalanche breakdown (a notorious noise source in FET's) of the junction with the substrate while the second and third drains are biased to a voltage below that required for avalanche breakdowns of their junctions. In this mode of operation the field effect transistor channel has not effectively been turned on to conduction. Therefore a field effect transistor structure is not essential for operation of this device since it does not operate as a field effect transistor in this mode and no "channel" exists. An alternative embodiment is shown in these patents in which at least one of the drains is of the same conductivity type as the substrate but more highly doped. This device is operated to produce a current between the source diffusion and the junction so that the device apparently operates more as a diode. These devices claim to have high sensitivity, relatively high signal output and good signal-to-noise ratios but are, as stated herein, not operated as field effect transistors. It is believed that they operate to accelerate holes diverted by a magnetic field and that these minority carriers in a deflection mode have improved sensitivity. The difficulties of avalanche breakdown control and generating sufficient hole-electron pairs to enable a hole current flow from the source to the drain may prove undesirable in certain applications. It is more desirable to use the majority carrier current, if possible, in field effect transistor structures operated as transistors.

The aforementioned U.S. Pat. Nos. 3,167,663 and 3,731,123 show other magnetic field detecting devices of the P-N junction type (bipolar). These devices operate essentially as diodes in which current flow can be changed or directed by the application of external magnetic fields. These devices are thought to be operated in the region of high current flow in which injected carriers are deflected by Lorentz deflection to result in lateral displacement of the carrier stream and a differential output signal between two or more P-N junction drains. These devices have intrinsically higher currents and, while they may be sensitive to magnetic fields, they are also more subject to noise current phenomena.

A similar type of device to the previously discussed patents is shown in U.S. Pat. No. 3,593,045 in which a beam of injected electrons created at a P-N junction in a semiconductor device is supposed to be deflected to one or more targets by electric or magnetic fields. This device is not operated as a field effect transistor, however, and, unfortunately, requires provision of relatively high biasing and driving voltages, typically on the order of 200 volts as described in the patent, which make it unsuited for application to field effect integrated circuits.

Another area in which the prior art has provided some development and investigation is in the field effect Hall devices such as that illustrated in U.S. Pat. No. 3,448,353, for example. These devices, of which U.S. Pat. No. 3,448,353 is typical, do not directly utilize the deflection of carriers in a field effect device but utilize the offset voltage produced by Lorentz deflection of equipotential lines of the carriers transverse to the input and output connections. The Hall devices are usually characterized as well as relatively low length-to-width ratios (under approximately three to one) and are best operated with equal width and length as is now well known in the art. The output signal in Hall devices, as is also well known, is proportional to carrier velocity and not to the number of carriers. Since these are not field effect transistor structures operated in the mode in which a beam of carriers is deflected and a differential output signal at the drains obtained, only a voltage output from the Hall output probes on either side of the channel can be used. It is preferable to have an actual signal current obtained at one or more of the drains as is the case with the aforementioned differential deflection field effect structure such as described in the aforenoted U.K. patent.

Still other related prior art is in the field of charge coupled devices which control the state of current flow in field effect transistor channels of relatively greater width such as that shown in U.S. Pat. No. 3,714,523 or in the IBM Technical Disclosure Bulletin, Volume 14, No. 11, April 1972, page 3420. The patented device provides high sensitivity for magnetic field detection. A differential control of the gate electrodes coupled back from the drains may be utilized to provide positive feedback to create extremely sensitive devices as described in the patent. Charge coupled devices of this type also provide an amplification factor and may be utilized to provide higher output signals. However, due to the relatively greater width of such devices and greater current flows, higher noise output voltages may be expected. Such noise is amplified by the feedback mechanism used, as well. Of course, the great width of these devices also indicates that the depletion zones on either side of the channel are an insignificant portion of the total channel width.

OBJECTS OF THE INVENTION

In view of the aforementioned difficulties in the prior art, it is an object of this invention to provide a high sensitivity channel conduction field sensor for fields of magnetic or electric origin which exhibits relatively low channel current and very low noise voltage outputs to achieve high signal-to-noise ratios at adequate signal bandwidth and output voltage levels.

It is another object of the present invention to provide an improved channel conduction sensor structure having a filamentary channel characterized by relatively high length-to-width ratios in which a narrow and confined beam of charge carriers may be maximally deflected to the left or right by a depletion width modulation mechanism to produce a highly sensitive, high resolution and low noise sensor.

A further object of this invention is to provide an improved channel conduction sensor in which there exist relatively wide depletion zones which are a relatively large proportion of the total channel width.

SUMMARY

The aforegoing and other objects of the invention are met by constructing, in either the enhancement mode or depletion mode of operation, a relatively long, narrow conduction channel device in which the conductive channel has relatively wide depletion regions along the sides thereof in proportion to the undepleted area within the channel. As used herein, such a device is called a Vinhall device to distinguish it from other channel conduction devices that will be discussed. The width and length parameters utilized to define a Vinhall device in general also describe the filamentary nature of the conductive channel. The conductive channel has a minimum width of at least twice the width of the depletion zone along either side of the channel. Such a width corresponds to a Vinhall width of zero. The length of such a device must be great enough to avoid shorting or breakdown in the conductive channel between the source and the drain. The resulting range of length-to-width ratios which may be defined corresponds to the creation of conductive channels for field sensitive devices which are approximately one to two orders of magnitude ($10^{-1}$ to $10^{-2}$) narrower than those previously contemplated. This factor leads to a consideration of the mechanism by which deflection of the charge carrier channel as defined by the depletion zone boundaries may occur and to the sources of noise in such sensors. When the operative mechanism and the sources of noise are understood properly, it is possible to construct devices having sensitivity and signal-to-noise ratios much greater than the prior art. Signal-to-noise ratios on the order of 50 to 1 to over 1,200 to 1 have been achieved using the present invention with normally experienced magnetic fields of 350 Gauss.

BRIEF DESCRIPTION OF DRAWINGS

The present invention will now be described with reference to illustrative drawings and charts which describe various aspects of the preferred embodiments thereof; a detailed analysis of the modes of operation and some sources of noise will also be given with reference to the figures as follows:

FIGS. 10A through 10C illustrate, respectively, the space charge region, the electric field and the potential voltage, respectively, that exist across the P-N junction existing along each edge of the conductive channel in devices of the general type according to the invention.

DETAILED SPECIFICATION

Figure 1:
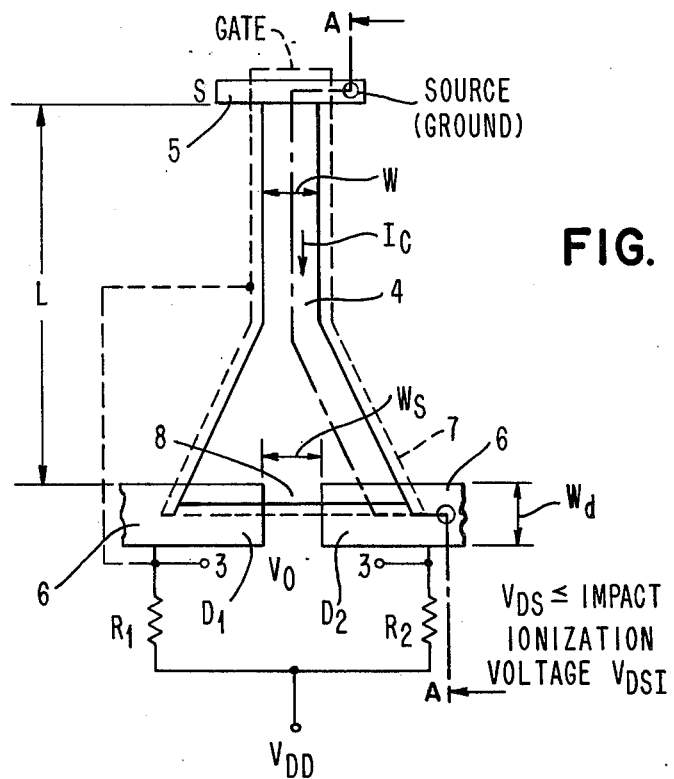
FIG. 1 illustrates a top or plan view of a schematic form of a filamentary channel conduction device created in or even beneath the surface of a semiconductive slab of material.

The theory of operation of the invention and the characteristics which distinguish it from similar devices will be described. At the outset, however, it is necessary to make several observations. Firstly, for the best sensitivity, the Vinhall device as I have herein defined it, is easily distinguished from other similar devices. The Vinhall device is characterized by having a conductive channel which, contrary to the teachings in the prior art, is made as narrow as is physically attainable. The present range and resolution of available photolithographic technology make possible the construction of Vinhall devices having conductive channels with widths on the order of one tenth of a mil (0.0001 inches or 2.5 microns). However, it is most desired to make the channel narrower still. The concept of the Vinhall channel width is herein defined as the total channel width minus twice the depletion region width within the channel. The minimum Vinhall width of the channel would be at least a few hundred Angstrom units in order to support at least some current flow. The narrowest limit of resolution for the manufacturing processes currently available does not permit the construction of such narrow conductive channels. However, the narrowest channels which may be formed operate adequately and improved performance will be achieved when the narrower channels as described are achieved. The present processes for forming semiconductive substrate channels yield total physical channel widths of approximately one tenth of a mil (0.0001 inches, 2.5 microns or 2.54 times $10^{-4}$Å). Therefore, the teaching of the present specification, while hindered in total realization by the available technology for the construction of the conductive channel, should not be construed to be limited thereby. What is intended is that the narrowest attainable channel down to or approaching the minimum width which has been defined for operability will be the preferred embodiment.

Secondly, the Vinhall device as characterized herein is a distinct type of charge carrier stream deflection detector. The device operates as a field sensor in an entirely different mode from the so-called Hall devices. One distinction is that the Vinhall device operates by deflecting the actual depletion zone boundaries which contain the stream of charge carriers and detects the effect thereof at two or more output drains.

Another distinction is that the carrier stream boundaries in the Vinhall device are varied by modulating the channel depletion zone widths for either constant velocity or velocity gradient carrier streams. The Hall device, in contrast to the Vinhall device, does not produce a current output signal and, indeed, no current can be drawn at the output terminals of a Hall device without interferring greatly with its operation.

As will appear herein, the Hall device output depends upon the existence of a carrier velocity gradient within its conductive channel and no signal will be produced without such a gradient. Also, the Hall device relies on the velocity gradient and not upon the number of carriers. The Hall device may be characterized as requiring a velocity gradient within the channel to operate at all in order to rotate equipotential voltage lines within the channel to induce an offset voltage output of the Hall probes. Any attempt to draw a significant current from the Hall output probe or probes will result in deteriorating the operation of the device by distorting the deflection pattern of the equipotential lines. The Vinhall device described herein quite effectively operates without any velocity gradient and is dependent instead upon the magnitude of velocity and upon the number of carriers moving within the channel. Furthermore, the carrier velocity and the Vinhall width are only of importance to the Vinhall device in the area of the channel in the vicinity of the drains.

Thirdly, and more importantly, the operation of a Vinhall device will be shown to be dependent upon the thickness of the channel, the Vinhall width, and the density per unit volume of the charge carriers existing in the substrate and in the conduction channel. This is in distinct contrast to the teachings of the prior art and understanding of the prior physical principles which tend to indicate that the widths of channel conduction devices should be increased rather than decreased to avoid charge crowding effects. As will be presently described, such teachings have been found to be in distinct error due to a lack of understanding of the charge crowding mechanism and an apparent ignorance of the true operative mechanism of the devices. What will be described is felt to be a correct and fundamental statement of the nature of the mechanism for operating magnetic sensors of this general type. It will be shown that better operation is provided by narrower channels instead of wider channels. Such a teaching is directly away from the knowledge and practice of the prior art. It makes possible the unexpected discovery that narrow conductive channels are, in fact, the most desirable ones for the Vinhall device.

THEORY OF INVENTION

Figure 6:
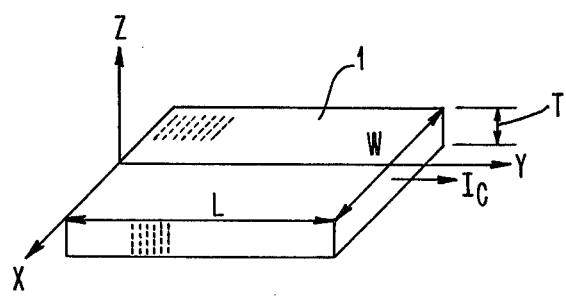
FIG. 6 illustrates, in schematic form, a diagram for calculating channel current for conduction in either of the modes or embodiments of the present invention.

Turning now to a discussion of the theory of operation of a Vinhall magnetic sensor, reference will be had to FIG. 6 initially in which is shown a typical slab of semiconductive material 1. Slab 1 may be any semiconductive material such as silicon, germanium, gallium arsenide or a variety of other related elements and compounds having intrinsic semiconductive properties well known in the art. In slab 1 are shown a plurality of charge carriers disbursed in equal spacing along the x, y and z axes. As shown in FIG. 6, width W is measured along the x axis, thickness T along the z axis, and length L along the y axis. There is no particular significance as to which axes are chosen for the representation and the nomenclature is chosen only for the purpose of discussion.

An analysis of a Vinhall structure requires the derivation of equations which define the channel current, and the sensor output functions and signal-to-noise ratios for such a device as contrasted with Hall devices.

The discussion will begin from an understanding of the first principles of physics. It is desired to define the existing dose density of electrons or carriers within the slab. In FIG. 6, the slab 1 which represents a small segment of a semiconductive channel either implanted in or induced into a semiconductive substrate by means well known in the art. The dose density of charge carriers will be defined in terms of volumetric density. Proceeding then, let:

$N_x$ = The number of charged carriers or ions in the slab in the x direction.

$N_y$ = The number of charged carriers or ions in the slab in the y direction.

$N_z$ = The number of charged carriers or ions in the slab in the z direction.

Now it may be assumed that there exists an average spacing between charge carriers, electrons or ions in any direction in slab 1 equal to a distance defined as d.

The total number of charge carriers, electrons, or ions, as they may be variously described, which will exist within the slab 1 in FIG. 6, which is understood to be a small portion of the conductive channel in a given substrate, will be given by:

$$N_{total} = N_x N_y N_z = WLT/d^3 \qquad \text{Eq. (1)}$$

Now $1/d^3$ can be defined as equal to $N_D$ the donor concentration which is the number of ions, charge carriers or electrons per unit volume within slab 1 existing in the conductive channel in a substrate. Therefore, Eq. (1) may be rewritten as follows:

$$N_{total} = N_D WLT \qquad \text{Eq. (2)}$$

The dose or fluence of electrons, charge carriers or ions in a segment of the x-y plane in FIG. 6 in a layer of thickness T will be defined as D. Therefore:

$$D = N_{total}/WL = N_D T \qquad \text{Eq. (3)}$$

Therefore, solving Eq. (3) for $N_D$ $$N_D = D/T \qquad \text{Eq. (4)}$$

The channel current $I_C$ through the slab 1 in FIG. 6 will be developed next.

A single electron wide beam of electrical current is defined as the change in charge per unit time dq/dt. This is equal to current taken in one of the axes in FIG. 6 and it will be assumed for purposes of explanation that the beam current $I_B$ will be along the y axis in FIG. 6. Therefore, the beam current $I_B$ can be defined as follows:

$$I_B = dq/dt = (dq/dy)(dy/dt) \qquad \text{Eq. (5)}$$

Stated otherwise, the beam current $I_B$ is equal to the unit charge of an electron q times the velocity $\underline{V}$ of the charge carrier divided by the spacing d between successive charge carriers, i.e.:

$$dq/dy = q/d \text{ and } dy/dt = \underline{V} \qquad \text{Eq. (6)}$$

Therefore:

$$I_B = (q/d)\underline{V} \qquad \text{Eq. (7)}$$

where V is the average carrier velocity along the y axis in FIG. 6 and d is the average spacing between carriers forming the electron beam directed along the y axis in FIG. 6. The Eq. (7) above is the effective current of a single electron stream or beam of carriers moving in the y direction. To extrapolate the single electron beam of carriers into a sheet of current across the entire width of the slab in the x axis shown in FIG. 6, a definition of the sheet current $I_S$ of a single layer of electrons across such a surface would be as follows:

$$I_S = I_B N_X \text{ or}$$

$$I_S = I_B(W/d) = (q/d)(W/d)\underline{V} \qquad \text{Eq. (8)}$$

This is to say that a sheet of current moving in the y direction is equal to the beam current $I_B$ multiplied by the number of electrons distributed along the x axis and moving in the y direction in that sheet. This is equal to W divided by the electron spacing d.

The total channel current moving in a given direction in FIG. 6 will be defined as $I_C$ and will be equal to the sheet current $I_S$ multiplied by the number of electrons or carriers distributed on the z axis in a thickness T to give the total volumetric current. For channel current moving along the y axis in FIG. 6, $I_C = N_z I_S$. This in turn may be defined as $(T/d)(q/d)(W/d)\underline{V}$ or:

$$I_C = N_D TWq\underline{V} \qquad \text{Eq. (9)}$$

where T is the thickness of the channel on the z axis.

Now the density of carriers in a planar cross section of thickness T was previously defined as D which is equal to the volumetric density of carriers $N_D$ times the thickness of the slab as previously shown in Eq. (3) above. Therefore, by substitution, Eq. (9) becomes:

$$I_C = DWq\underline{V} \qquad \text{Eq. (10)}$$

Stated otherwise, the total channel current is equal to the dose density of carriers multiplied by the width of the channel times the unit charge q and the velocity of the carriers $\underline{V}$.

The carrier velocity term $\underline{V}$ can be rewritten in terms of first principle physics by assuming that there exists a uniform longitudinal electrical field along the channel in the direction of carrier motion. This assumption actually creates a first order approximation to the actual existing electrical field along a channel in the direction of motion as follows: If the existing electric field is defined as $E_L$ and the mobility of carriers as $\mu$, from first principles, velocity $\underline{V}$ is defined as the product of electric field E and mobility $\mu$. The existing electrical field in a channel conduction device of the class described may be approximated where there exists a drain and source for a semiconductive channel as the voltage $V_{DS}$, i.e., the drain-to-source voltage divided by the length between the drain and the source, L. Therefore, $$E_L = V_{DS}/L \text{ and,}$$
$$\underline{V} \simeq \mu(V_{DS}/L) \qquad \text{Eq. (11)}$$

APPLICATION OF THEORY

Turning now to FIG. 1, the principles developed so far will be applied to a typical Vinhall sensor channel configuration shown in plan view as in FIG. 1 having a total channel length L, a total channel width through the area where the electron beam is being generated of W, and having a source S and, at least, two drains $D_1$ and $D_2$, all existing in the surface or buried beneath the surface of a substrate of semiconductive material. In FIG. 1 a typical source 5 which would be connected, for example, to ground potential is shown at one end of a conductive channel 4 having length and width as described and terminated by at least two mutually exclusive drain regions 6 ($D_1$ and $D_2$). The drain regions 6 are connected to an output circuit through resistors $R_1$ and $R_2$ to produce an output voltage $V_o$ at the terminals 3. The drains 6 are connected to a drain voltage source $V_{DD}$ and the voltage between the drains 6 and the source 5, $V_{DS}$, must be held below that at which impact ionization occurs.

In FIG. 1, the main channel of semiconductive material is identified as numeral 4, the source as numeral 5 and the drains as numeral 6. A metallic gate or electrostatic shield 7 is shown in phantom lines overlying the general area of the conductive channel 4. As is well known in the art, a gate is utilized in the enhancement mode of semiconductive field effect devices to induce an effective dose of charge carriers to form a conductive channel between the source and drain or drains, respectively. In FIG. 1, for silicon technology, gate 7 would be operated, for example, with approximately a ten volt potential.

It will be noted that the area of channel 4 in the vicinity of drain 6 is widened or flared out from its width W generally existing closer to source 5. The reason for this is that the limits of resolution in the existing technology for forming a semiconductive channel are pushed to their utmost in the present embodiment. Therefore, width W, although not to scale in the drawing, represents the narrowest limit of resolution by which a semiconductive element may be formed with existing technology. The width $W_d$ of the drains 6 also is approximately the same dimension. Since it is desired to make the width of channel 4 as narrow as possible, it follows that the width of the drain regions can be no narrower since they are all at the limit of resolution. Therefore, it is desirable to flare or widen the channel 4 where it connects to the two or more drains 6 since it would be physically impossible to attach drains 6 to the end of a channel having width W when the minimum width of each of the drains would be equal to W. Stated otherwise, the gap 8 between the two drains 6 would be forced to have a width of $W_s$ since it is the minimum width which can effectively be controlled due to the resolution of the semiconductor manufacturing processes employed. However, techniques exist for narrowing gap 8 to a slit of still smaller dimensions, as is desirable.

There exist other reasons for flaring the channel 4 in the vicinity of drain 6 which will be discussed in greater detail below, but for the present, it should be understood that it is desired to make channel 4 as narrow as possible and to make the drains 6 equally as narrow and attach them to the narrow channel in an independent manner such that there exists a slit 8 or gap of minimal width between the drains. Since the limits of resolution of the available forming processes presently employed limit the width of a channel to a width W, the spacing 8 which can be accurately controlled is initially of similar dimensions although techniques exist as will be shown for narrowing slit 8 further. It becomes necessary to flare the channel 4 in the vicinity of drains 6 for these and other reasons as will be shown. It is also a very desirable configuration since the flaring of the channel contributes to reducing noise, increasing sensitivity, and eliminating other potential problems as will be discussed in some detail later.

Having described a typical embodiment of the invention with relation to FIG. 1 and having given some discussion of the channel current derivation for the device, we will now return to consider the current conditions and operating requirements and characteristics of a device such as that shown in FIG. 1.

Substituting Eq. (11) into Eqs. (9) and (10) yields the following channel current expression:

$$I_C = N_D T(W/L) q\mu V_{DS} \qquad \text{Eq. (12A)}$$

or $$I_C = D(W/L)q\mu V_{DS} \qquad \text{Eq. (12B)}$$

Figure 9:
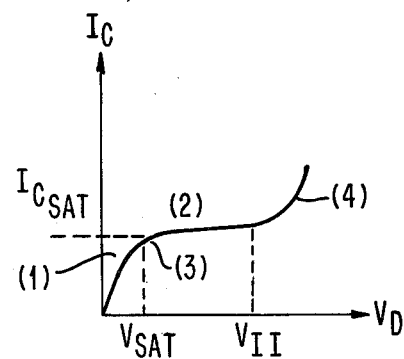
FIG. 9 illustrates a typical drain current versus voltage curve for a FET device and shows the regions of operation and the critical points thereof.

Eqs. (12A) and (12B) shown above are alternative expressions for the channel current $I_C$ in the device such as shown in FIG. 1. As is well known to those of skill in the art, devices such as shown in FIG. 1 operate with a drain current characteristic as shown in FIG. 9. This drain current graph is typical of the so-called field effect transistors in general and exhibits several characteristics, well understood, as the linear region (1), saturation region (2), and pinch-off (3) as well as impact ionization region (4). At pinch-off, although the drain-to-source voltage may be increased, the current conduction does not greatly increase until impact ionization, avalanche or other similar breakdown phenomena occur at excessively high drain-to-source voltages. The channel current at saturation or pinch-off is, therefore, given as follows:

$$I_{C_{Sat}} = N_D T(W/L)q\mu \underline{V}_{Sat} \qquad \text{Eq. (13A)}$$

or, alternatively $$I_{C_{Sat}} = D(W/L)q\mu V_{Sat} \quad \text{Eq. (13B)}$$

For drain-to-source voltages in a channel which are above pinch-off but below impact ionization, the channel current equations are as follows:

$$I_C = N_D T\left(\frac{W}{L}\right) q\mu V_{Sat}\left(\frac{L}{L - L_D}\right) \quad \text{Eq. (14A)}$$

$$I_C = D\left(\frac{W}{L}\right) q\mu V_{Sat}\left(\frac{L}{L - L_D}\right) \quad \text{Eq. (14B)}$$

In the equations above, L is the total length of the channel between source 5 and drains 6. As is understood by those of skill in the art, a pinch-off region can be formed in a channel conduction device and the pinch-off region will form in the vicinity of the drains creating a depleted portion of channel length $L_D$. The effective length of the undepleted portion of the channel, therefore, is shortened to $L - L_D$.

The derivation of channel current in a field effect device or in a channel conduction device for the various areas of its operation in a drain current curve as shown in FIG. 9 have previously been derived in my copending patent application Ser. No. 701,339 now U.S. Pat. No. 4,048,648 wherein the $L/(L - L_D)$ terms introduced in the above equations are examined with relation to the operation of such a device. It is not necessary to reproduce that derivation here. Suffice it to say that the dependence of drain or channel current on the length of the channel divided by the total remaining undepleted length (that length extending up to the pinch-off zone) has been experimentally verified and theoretically analyzed and justified so that the equations above are an accurate representation of the operation of devices such as shown in FIG. 1.

When the conduction channel of a device such as shown in FIG. 1 is buried below the surface of a substrate, a pinch-off voltage still exists but must be arrived at by other considerations. These considerations will not be given here in detail since they may be approximated by the junction field effect device (J-FET) analysis given in *Physics of Semiconductor Devices* by S. M. Sze, page 341 et seq. I have expressed the pinch-off voltage for a J-FET in modified form and defined as $V_{D\,Sat}$ as follows:

$$V_{D\,Sat} = 3(qN_D T^2/2e_S) = 3(qDT/2e_S) \quad \text{Eq. (15)}$$

In Eq. (15) above, $e_S$ is the dielectric constant for the semiconductive material employed. For silicon, $e_S$ is approximately equal to $1.05 \times 10^{-10}$ Farads/meter.

Substituting Eq. (15) into Eq. (14A) and Eq. (14B) above gives the following:

$$I_C = 3(N_D T)^2 q^2 T\left(\frac{W}{L}\right)\frac{\mu}{2e_S}\left(\frac{L}{L - L_D}\right) \quad \text{Eq. (16A)}$$

$$I_C = 3D^2\left(\frac{W}{L}\right) q^2 T\frac{\mu}{2e_S}\left(\frac{L}{L - L_D}\right) \quad \text{Eq. (16B)}$$

Having derived the foregoing expressions from the basic physical principles which characterize the flow of charge carriers in a semiconductive channel device, attention will next be focused on the development of the Vinhall theory of operation. Attention will also be focused on applying the Vinhall theory to both the Vinhall device and to a Hall device for comparison and upon analyzing the faults in the prior art theory.

A description of the Vinhall sensor and its mode of operation will now be given. An analysis of the Vinhall sensor based upon the first principles of physics involved follows.

Figure 12:
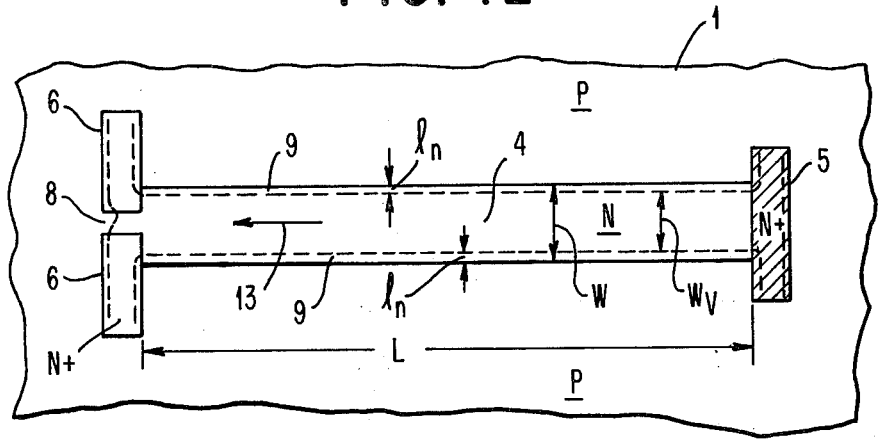
FIG. 12 illustrates a typical sensor constructed according to the invention and shows the depletion width zones therein.

In FIG. 12, a typical Vinhall sensor conduction channel 4 is illustrated in a greatly enlarged not-to-scale view. A source 5 and at least two drains 6 are appropriately positioned as shown at opposite ends of channel 4. Channel 4 has a length L and a total width W. It will be assumed that an initial stream of carriers 13, which would be electrons in the present case, would be injected into channel 4 and would move directly down the center of the channel.

The prior art publications and patents have usually described magnetic sensors in terms of Hall devices or in terms of electron deflection devices. As will now be shown here, the Vinhall device is not a Hall device and its theory and mode of operation lend credence to the notion that the theory presented to date for Hall devices themselves and for magnetic sensors of the same general type is incorrect.

The prior art concept utilized for analyzing magnetic sensors is essentially a "ballistic" theory of electron or carrier deflection which is based upon deflection of the carriers by a Lorentz force. The theory is also predicated on the concept that the walls which define the channel boundaries and confine the stream of electrons or carriers are rigid and immovable. These concepts also suggest that the stream of electrons is deflected within the channel by the Lorentz force exerted on moving carriers in the presence of a magnetic field. This force is then believed to cause "clouds" of electrons and holes to appear on the rigid channel walls which create an electric field to oppose the further deflection of the electrons. These "clouds" of charge inhibit further deflection of the electrons and are thought to be responsible for the creation of the so-called Hall voltage. The following analysis will show that the rigid, immovable wall and ballistic electron deflection model and theory are false and misleading.

Figure 8:
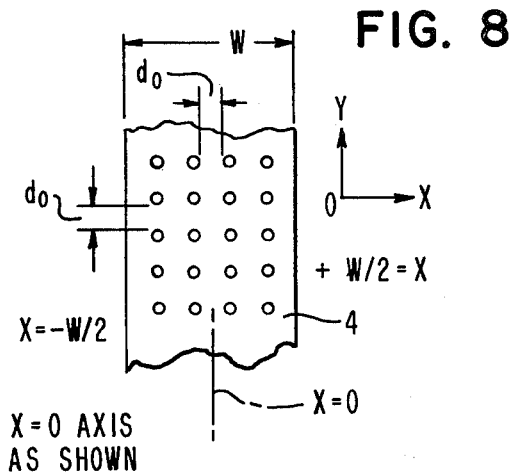
FIG. 8 illustrates a small segment of a conductive channel viewed in a top view and showing a hypothetical spacing of charge carriers confined by the channel boundaries.

Turning to FIG. 8, an illustration is given of a top or plan view of a segment of a channel of semiconductive material 4. Channel segment 4 has a total width W and contains electrons or other carriers shown in a uniform space array in which the carriers are spaced apart by a distance $d_0$ in the x and y directions. The channel segment 4 has been placed on an x or y axis so that it is symmetrical about its center line, i.e., the center line is the y axis and the $x = 0$ axis, so that the boundaries of the channel 4 are each located at a width of $W/2$ plus or minus in the x direction.

One assumes that the walls or channel edges located at $x = \pm W/2$ are rigid and immovable in the classic theory of Hall devices, and it follows that if electrons are deflected within the channel, they must be crowded together toward and along one wall or channel edge and depleted along the opposite channel edge. The alleged crowding is produced by the Lorentz force acting on the carriers moving in the presence of a magnetic field normal to the channel which will deflect the carriers in a path defined by the ballistic model.

To see the flaw in this reasoning, it is only necessary to observe that the electrostatic force of repulsion between like charges (electrons) under the circumstances involved is too great to allow any significant deflection to be produced by a Lorentz force. It can be shown that the Coulomb force between electrons uniformly spaced in the x direction may be defined as follows:

$$F_x = q^2/4\pi e_S d^2 \qquad \text{Eq. (17)}$$

in which d is the distance between electrons, $e_S$ is the dielectric constant of the medium separating the charges, and q is the unit charge of an electron.

The force produced on an electron by an externally applied electric field is given also as $$F_x = qE_x \qquad \text{Eq. (18)}$$

By equating the Eqs. (17) and (18) which represent the force produced on the electron, one may solve to determine the electric field $E_x$ existing between the electrons. This is given as follows:

$$E_x = q/4\pi e_S d_0^2 \qquad \text{Eq. (19)}$$

wherein $d_0 = x_0$, the initial or rest spacing between carriers.

It will be interesting to determine for one of these electrons how far it may be displaced in the x direction as a result of the x directed Lorentz field produced on a charge carrier moving in the presence of a magnetic field. The Lorentz field in the x direction $E_x$ is given by the following formula:

$$E_x = \underline{V}_y B_z \qquad \text{Eq. (20)}$$

Differentiating Eq. (19) with respect to x gives the following:

$$dE_x/dx = -(q/2\pi e_S) \times (1/x_0^3) \qquad \text{Eq. (21)}$$

Now, the standard definition given for donor concentration in a channel or semiconductor material is $N_D = 1/d_0^3$ where $d_0$ is the average electron spacing. By definition, since $d_0 = x_0$ as identified above, Eq. (21) can be rewritten as follows:

$$dE_x/dx = -(q/2\pi e_S) \times N_D \qquad \text{Eq. (22)}$$

Given $dE_x = \underline{V}B$, which corresponds to the Lorentz field, and solving Eq. (22) for $\Delta x$, one finds the following:

$$/\Delta x/ = 2\pi e_S \underline{V} B/q N_D \qquad \text{Eq. (23)}$$

Now, assuming that the maximum or best values for the variables in Eq. (23) are chosen, and solving Eq. (23) for $\Delta x$, we may obtain an expression for the distance x that a carrier under the maximum favorable circumstances may be deflected by the Lorentz field. The values assumed are as follows:

$\underline{V} = 10^7$ centimeters/second. This is the maximum velocity that a carrier may attain. $e_S = 1.05 \times 10^{-12}$ farads/centimeter, assuming a silicon material. $B = 350 \times 10^{-8}$ webers/centimeter$^2$, which equals 350 Gauss. This is the maximum field typically experienced just above the surface of a magnetic tape, for example. $q = 1.6 \times 10^{-19}$ coulombs/unit charge on an electron and $N_D = 10^{17}$ ions/cubic centimeter. The Lorentz field $\underline{V}_y B_z$ produced under such circumstances is directed along the x axis and is approximately 35 volts/centimeter.

Inserting the above-noted values for the variables into Eq. (23) one obtains the result of $\Delta x = 1.44$Å or $1.44 \times 10^{-8}$ centimeters.

This deflection distance $\Delta x$ corresponds to the production of a Hall voltage which is at least one order of magnitude less than the result actually obtained in the prior art for a Hall output voltage under the circumstances noted above. The prior art rigid channel wall device concept, therefore, is apparently defective. There is essentially no deflection produced on the charge carriers by the Lorentz field and no resultant "crowding" or "charged cloud" of electrons can result under even the most optimal conditions.

The prior art theory is not only demonstrably incorrect, but it leads to the incorrect conclusion. The essential ingredients which lead to obtaining high magnetic field sensitivity are obscured by the rigid wall assumptions. For example, it is often stated that it is most desirable to maintain a wide channel to avoid charge crowding. Since the electrons are essentially undeflectable by the typical Lorentz fields experienced in prior art devices as shown above, the notion of rigid channel walls is invalid. The magnitude of the depletion width modulation mechanism which does exist along the channel sides by action of magnetic or electric fields is the important factor, not the channel width as will now be shown.

Figure 11A:
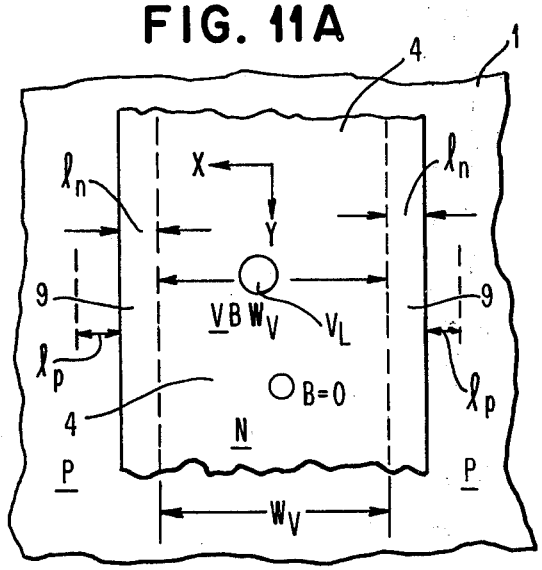
FIGS. 11A through 11C illustrate the mechanism of depletion width modulation and show how depletion width modulation effectively moves the conductive channel boundaries in devices constructed according to the invention.

Consider FIG. 11A, for example, where a segment of channel 4 is illustrated. The segment of channel 4 is understood to be formed within a semiconductive substrate area 1. The substrate material is illustrated as being a P-type and the channel itself is of N-type material. The source 5 and the drain 6 are not shown. This source and drains would be of N+ type and all are formed using well-known technology for creating either an enhancement or depletion mode device.

It will be observed that P-N junctions exist along the boundaries of the channel and at the source and the drains wherever the N+-type material abuts the P-type substrate material.

As will be shown in greater detail below, there is a depletion zone created at all P-N junction interfaces in the device, including the bottom, sides, ends and in some cases, the top of the conductive channel itself. The analysis given herein is limited to a two dimensional view ignoring depth modulation of the depletion zones at the top and the bottom of the channel. The effect of this simplification does not detract appreciably from understanding the basic operative mechanism at work in the invention. It should be understood, however, that the depletion width modulation equations would, in the final analysis, have to be modified slightly to account for the three dimensional effect.

It is well known that a depletion layer is formed at P-N junctions. This depletion layer within the N-type material is illustrated in FIG. 11A by the dashed line inside of the channel 4 and is identified by the numeral 9. The layer 9 is formed in the vicinity of the P-N junction existing around the inner periphery of the channel and including the source and drains as shown in FIG. 11A. The width of the depletion areas 9 is identified as either $l_{n_L}$ or $l_{n_R}$ for the left and right depletion width, respectively, or merely as $l_n$ if the left and right depletion widths are equal. A similar layer exists in the P-type material surrounding the channel and it has a width $l_p$. Particularly with regard to the depletion layer 9 existing along the inner edges of channel 4, the following observation is pertinent. Electrons are conducted within the undepleted portion of the channel only. The width of this portion of the channel is less than the physical width W which the channel exhibits by 2 $l_n$ where the left and right depletion widths are equal. The conduction portion of the channel's width is herein named the Vinhall width and is defined as follows where the width of the depletion zones on both sides of the channel are equal:

$$W_V = W - 2 l_n$$  Def. 1 or, where the depletion boundaries on both sides are not equal.

There exist a space charge potential, an electric field and a voltage potential across the boundary exhibited at the P-N junctions. FIGS. 10A through 10C illustrate the space charge region, the electric field and the potential that exist in the vicinity of a P-N junction formed at an interface between the channel material and the substrate such as shown in FIGS. 11, 12, 14, 15, etc.

FIGS. 10A through 10C are aligned along a vertical axis identified as the metallurgical junction. This junction is also known as the Stochastic boundary or location of the P-N junction at which the donor and acceptor concentrations are equal. In FIG. 10A, the space charge is shown as a positive and negative charge distributed about the metallurgical junction with a positive charge in the N-type region and a negative charge in the P-type region. The nature of the distribution of this space charge is not well understood and only a crude approximation is shown in FIG. 10A. Due to the nature of the approximation shown, only general observations can be drawn from FIG. 10A. Firstly, there are different depletion widths $l_p$ and $l_n$ which exist in the P-type and N-type materials, respectively as a function of the acceptor and donor concentrations, respectively. Secondly, the magnitude of the space charge in the regions is the product of the donor density $N_D$ times the carrier charge q. Similarly, in the P-type region, the density of acceptors is $N_A$ times the electric charge q. Depending on the convention chosen for the sign of charge, the space charge in the P-type region is either plus or minus and that in the N-type region is either minus or plus, respectively. The convention chosen here is that charge in the N-type region is positive and in the P-type region is negative.

FIG. 10B illustrates the electric field existing between the depletion boundary edges in the P-type material and the N-type material across the metallurgical junction or Stochastic boundary.

The electric field can be determined by applying Gauss' law to the space charge distribution illustrated in FIG. 10A. The electric field so derived is shown in FIG. 10B. The expression shown in FIG. 10B is useful for developing a value for the potential as shown in FIG. 10C by integration. The potential is of interest because it governs the width of the depletion zone on either side of the Stochastic boundary and must be understood thoroughly before a depletion width modulation expression may be developed.

In FIG. 10C, the voltage potential which exists at any point within the depletion zone is either the P- or N-type materials is illustrated as a maximum internal potential $\psi_0$. This potential is defined for semiconductive materials as equal to:

$$\psi_0 = (KT_o/q) Ln (N_A N_D/N_i^2)$$  Eq. (24)

Where Ln is the natural logarithm operator, K is Bolzmann's constant, $T_o$ is the Kelvin temperature, and $N_i$ is the intrinsic carrier concentration in the substrate.

It can be shown that the width dimension $l_n$ of the depletion zone area within the channel 4 is approximated by the following equation:

$$l_n = [\frac{2e_S}{q} (\psi - V) \frac{N_A}{N_A + N_D} \frac{1}{N_D}]^{\frac{1}{2}}$$  Eq. (25)

Where the potential V is applied external to a P-N junction.

It is understood that the expression in Eq. (25) is an approximation for the depletion layer width within and along the channel sides or bottom. A precise expression depends upon the actual distribution of space charge (donors and acceptors) which would be developed adjacent to the metallurgical junctions forming the depletion boundaries. The form and distribution of these regions is presently unknown. The expression given is the best currently available (see "Physical Electronics and Circuit Models of Transistors" by P. E. Gray, et al, pages 8–23, published in 1964 by John Wiley and Sons, New York).

In the above expression, $N_D$ is the donor concentration within the channel, $N_A$ is the acceptor concentration within the substrate material surrounding the channel, e is the dielectric constant for the material involved and q is the electron unit charge.

Now, as noted above, the effective width of the conductive area within the channel is reduced from the physical width W by twice the depletion width $l_n$ from Eq. (25). Stated otherwise, the Vinhall width $W_V$ for a steady state condition at a given voltage V is defined as follows where both the left and right boundary depletion widths are equal:

$$W_V = W - 2[\frac{2e_S}{q} (\psi - V) \frac{N_A}{N_A + N_D} \frac{1}{N_D}]^{\frac{1}{2}}$$  Eq. (26)

or $W_V = W - (l_{n_L} + l_{n_R})$ in the case where the left and right depletion widths $l_n$ are not equal.

From Eq. (26) it is evident that the width of the depletion layer $l_n$ along each sides of the channel depends upon a depletion width modulation voltage V applied external to the junction. This voltage may be developed within the channel as a result of the Lorentz field $\underline{V}B$ developed across a channel with Vinhall width $W_V$. The Lorentz voltage $V_L = \underline{V}BW_V$ is directed in the x direction given carriers moving down the channel in the y direction and a magnetic field being applied normal to the channel.

FIG. 11A illustrates the creation and application of the Lorentz voltage $V_L$ acting in the x direction toward the depletion boundaries along the channel edges. The general definition for Lorentz voltage $V_L$ is given as a contour integral $$V_L = \oint_{-\frac{W_V}{2}}^{\frac{W_V}{2}} V_y \times B_z \cdot dx,$$

taken between the P-N junctions forming the channel sides. The depletion layers 9 which exist along each edge of channel 4 in FIG. 11A are shown before the application of a magnetic field normal to the figure, i.e., in or out of the drawing.

Figure 11B:
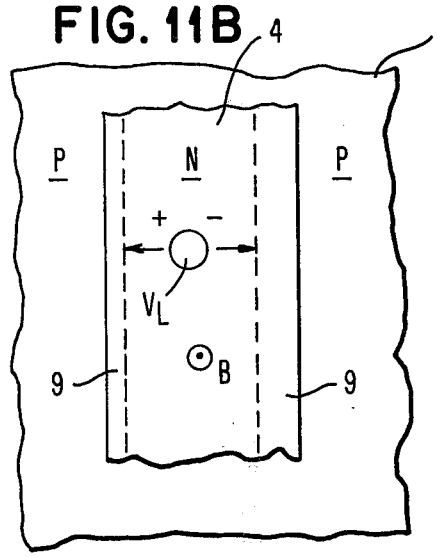
Figure 11C:
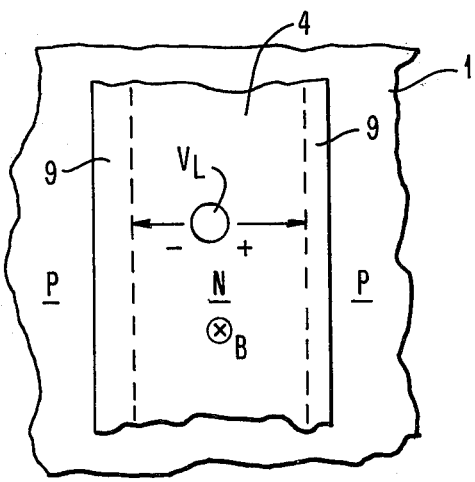

If a magnetic field is directed normal to channel 4 and coming out of the page, a Lorentz voltage will be produced which, according to Eq. (25) above, will change the width $l_n$ of the depletion layers 9 at each edge of channel 4. In FIG. 11B, the magnetic field is directed out of the page and it will be seen that because of the depletion width layer modulation, both the depletion boundaries $l_{n_L}$ and $l_{n_R}$ move by an equal amount to the left in FIG. 11B thus reducing the width of $l_{n_L}$, but increasing the width of $l_{n_R}$ by an equal amount. This effectively moves the conductive portion of the channel to the left, but maintains the width $W_V$ as a constant. The opposite condition is shown in FIG. 11C where the field is reversed and the effective boundaries of the channel move by an equal amount to the right. It will be noted that the Vinhall width $W_V$ remains essentially constant and independent of the Lorentz field, $\underline{V} X B$ because equal variations in depletion boundary widths are added and subtracted from the pre-existing depletion widths. A most interesting phenomenon has thus been described in which the erstwhile assumed rigid and immovable boundaries are actually moved when the carriers themselves within the channel could not effectively be deflected by the Lorentz field. It is interesting to calculate an approximate relationship which may exist and to express the deflection distance for the channel boundaries which results when the Lorentz voltage, in the x direction, is applied to the channel boundaries.

Rewriting Eq. (25) by inserting into the $\psi_0$ term the Lorentz voltage $V_L = VBW_V$ gives the following:

$$l_n = \left[ \frac{2e_S}{q} \left( \frac{KT_o}{q} + VBW_V \right) Ln \left( \frac{N_A N_D}{N_i^2} \right) \left( \frac{N_A}{N_A + N_D} \right) \left( \frac{1}{N_D} \right) \right]^{\frac{1}{2}} \quad \text{Eq. (27)}$$

Eq. (27) is simplified by making the following substitutions and neglecting the effects of drain voltage as a function of position along the channel and particularly close to the drains where pinch-off occurs.

$$\alpha = 2e_S/q \, Ln \, (N_A N_D/N_i^2) \quad \text{Eq. (28)}$$

$$\alpha = \frac{2e_S}{q} Ln \left( \frac{N_A N_D}{N_i^2} \right) \quad \text{Eq. (28)}$$

$$\gamma = \frac{N_A}{N_A + N_D} \left( \frac{1}{N_D} \right) \quad \text{Eq. (29)}$$

$$l_n = [\gamma \alpha ( \frac{KT}{q} + VBW_V)]^{\frac{1}{2}} \quad \text{Eq. (30)}$$

NOTE: In this analysis, the effects of drain voltage as a function of position along the channel have been neglected. This resulting expression is valid in the vicinity of the drains where pinch-off occurs.

Differentiating Eq. (30) with respect to B gives the following:

$$dl_n/dB = \frac{1}{2} (\gamma \alpha/l_n) V W_V \quad \text{Eq. (31)}$$

Substituting $l_n$ given by Eq. (30) into Eq. (31) and rearranging Eq. (31) gives the following:

$$\frac{dl_n}{dB} = \frac{1}{2} \sqrt{\frac{\gamma \alpha}{\frac{KT_o}{q} + VBW_V}} \, (VW_V) \quad \text{Eq. (32)}$$

Further substituting Eq. (28) for $\alpha$ gives:

$$\frac{dl_n}{dB} = \frac{1}{2} \sqrt{\frac{2e_S Ln \left( \frac{N_A N_D}{N_i^2} \right) \gamma}{\frac{KT_o}{q} + q VBW_V}} \, (VW_V) \quad \text{Eq. (33)}$$

Making a further substitution:

$$K_i = \frac{2e_S}{\frac{KT_o}{q} + qVBW_V} Ln \left( \frac{N_A N_D}{N_i^2} \right) \quad \text{Eq. (34)}$$

gives:

$$dl_n/dB = \frac{1}{2} \sqrt{K_i(\gamma)} \, (VW_V) \quad \text{Eq. (35)}$$

Substituting Eq. (29) for $\gamma$ into Eq. (35) and defining $S = dl_n$ as the displacement of the depletion width boundary, one achieves the following:

$$S = \frac{1}{2} \sqrt{K_i \left( \frac{N_A}{N_A + N_D} \right) \frac{1}{N_D}} \, (VW_V) dB \quad \text{Eq. (36)}$$

or $$S = \frac{1}{2} \sqrt{K_i T \left( \frac{D_o}{D_o + D} \frac{1}{D} \right)} \, (VW_V) dB$$

Since $N_D T = D$
$N_A T = D_o$

Eq. (36) gives the expression for the movements of the depletion boundaries given a magnetic field with density B. Thus, both the left and right depletion boundaries $l_n$ are displaced a distance S in the same direction as a result of the Lorentz field acting in the x direction. This results in maintaining a constant Vinhall width, $W_V$, but moves the entire conductive portion of the channel to the left or right by a distance S.

It is interesting to calculate this deflection distance S utilizing the same assumptions as were used for the ballistic deflection model. This results in the following:

$$S = 60 \text{\AA}$$

given $D_o = 3 \times 10^{11}$ $\underline{V} = 10^7 \text{CM/sec}$
$D = 2 \times 10^{12}$ $K_i = 6 \times 10^9$
$T = 2000 \text{\AA}$
$W_V = 3 \times 10^{-4} \text{CM} (0.13 \text{ mils})$ Clearly, the depletion boundaries are calculated to move approximately 50 times as far as that distance calculated for electron deflection.

It is now desired to determine how the Vinhall output signal is affected by translating the depletion boundaries by a distance S.

Referring again to FIG. 12, two drains 6 are shown separated by a slight space or slit 8. These drains are at the left-hand end of the channel 4 and obviously will collect the total channel current which is unaltered by the magnetic field. However, since the drains 6 are separate and the channel boundaries move up or down in FIG. 12 by the introduction of a magnetic field as just described, differential current variations will be experienced at the split drains 6. It can be shown readily that the Vinhall sensitivity $\Delta I/I$ is given by the following equation:

$$\eta_v = \Delta I_c/I_c = 2S/W_V \qquad \text{Eq. (37)}$$

By substituting Eq. (36) for S in Eq. (37) the following expression for sensitivity is achieved:

$$\eta_v = \sqrt{K_i \left(\frac{D_o}{D+D_o}\right) \frac{T}{D} (V) dB} \qquad \text{Eq. (38)}$$

It is important to recognize that the sensitivity $\eta_v$ L of the Vinhall sensor is inversely proportional to the Vinhall width $W_V$ if the product $\underline{V}BW_V$ is greater than $KT_o/q$. It is also most important to recognize that the form of these equations is governed by the expression chosen for the depletion length on opposite sides of the metallurgical junction. It must also be recalled that the expression used is only approximate as noted above since the actual space charge distribution across the depletion boundaries is unknown. Furthermore, only a two dimensional analysis was given above even though the depletion width modulation phenomenon is a three dimensional one. For an insight into the three dimensional nature of depletion width modulation, reference will be had to FIGS. 15A through 15E.

Figure 15A:
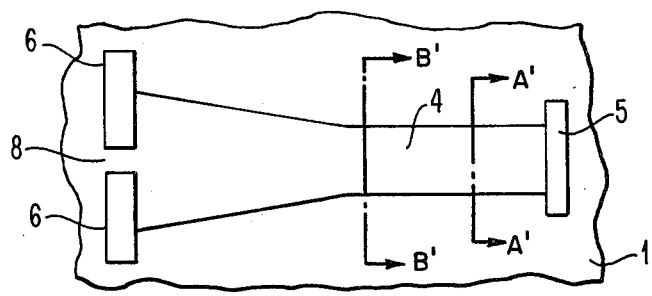
FIGS. 15A through 15E illustrate the third dimensional depletion boundary width modulation effects in addition to the lateral or two dimensional width modulation as it occurs in devices constructed according to the invention.

FIG. 15A illustrates a plan view of a typical Vinhall sensor with cross-sectional view lines shown as AA and BB at various points along the length of channel 4 between source 5 and drains 6.

Figure 15B:
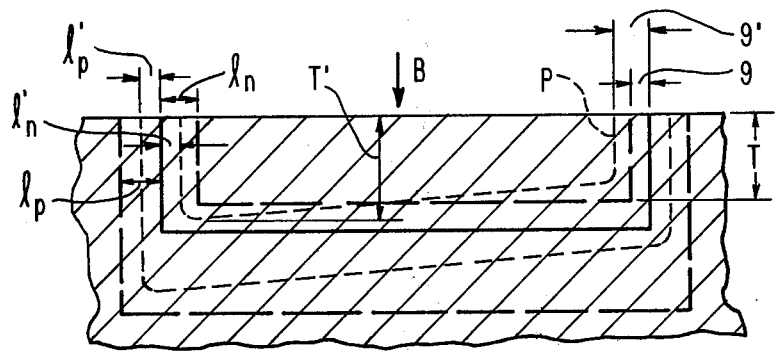

FIG. 15B illustrates in cross section the view along line AA in FIG. 15A. It may be seen that there exists a quiescent depletion boundary prior to the time that a magnetic flux B is applied to the channel. The quiescent depletion boundary has associated therewith depletion widths in the N- and P-type materials known as $l_n$ and $l_p$, respectively. The thickness of the channel T is also shown. When the magnetic flux B is applied downward as shown in FIG. 15B, not only do the lengths $l_n$ and $l_p$ vary to the position shown by the dashed line in FIG. 15B, but the depth of the channel varies to a new thickness T' as shown. It should be noted that T' varies across the width of the channel and reduces the thickness at one edge and increases it near another.

Figure 15C:
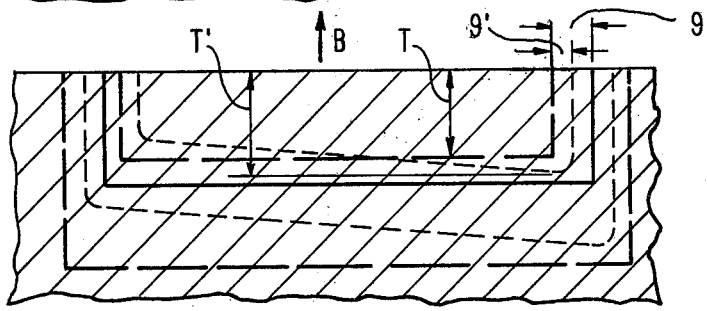

The opposite situation is shown in FIG. 15C with a magnetic flux vector B that is directed upward. Again, the dashed line illustrates the deflected depletion boundary creating new depletion layers 9' and new thicknesses T' as shown.

Figure 15D:
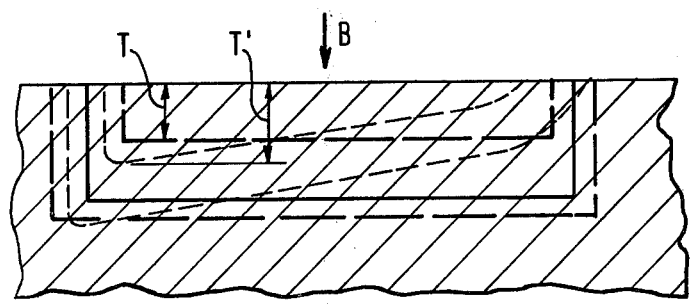
Figure 15E:
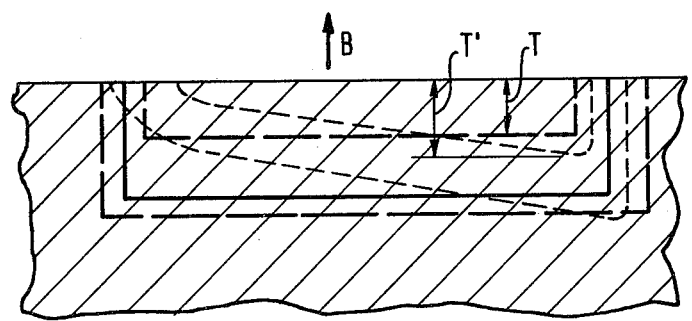

FIGS. 15D and 15E illustrate the cross-sectional view taken along line BB in FIG. 15A. This section is closer to the drains than section AA as shown in FIG. 15A. It is known, as a result of the buildup of drain voltage as one approaches the drains moving along the channel, that the thickness of the channel decreases. Thus, FIGS. 15D and 15E illustrate a smaller initial thickness T than that shown in FIGS. 15B and 15C. The effects of the flux vector B are similar, however, to that shown in FIGS. 15B and 15C. It should be understood that the effects of depletion width and depth modulation occur simultaneously within the channel at the cross sections AA and BB as shown. The mathematical solutions to these indicated three dimensional effects are most complex. The analysis presented herein describes the side wall motion only and, despite this limitation, the agreement between the experimental results and the developed formulations is quite precise.

It may be expected that these equations developed above will require refinement as the nature of the metallurgical junction, the effects of pinch-off upon channel geometry, and the nature of the distribution of the space charge across the metallurgical junction all become better understood. The general observations which follow are not affected by these problems, however, since ratios of calculated results are utilized rather than the absolute numerical result.

Recalling Eq. (38) from above, it may be seen that high sensitivity may be achieved by reducing the total channel width such that $B\underline{V}W_V$ is less than or equal to $T_oK/q$, a result that is entirely contrary to the stated prior art technique and a most unexpected one. In fact, it will be noted also that there is a reciprocal relationship between the Vinhall and Hall devices as will be shown below. It is apparent that the Vinhall width should be made small and that the width of the depletion layers should represent a relatively large fraction of the total channel width so that a greater effective deflection of the channel boundaries can be obtained. It will also be shown that the Hall device output depends upon the existence of a gradient in carrier velocity and that this has not apparently been recognized before. The dependence of the Hall device operation upon a velocity gradient accounts for some of the discrepancies between observed results and prior Hall theory.

Before a comparison is made using the Vinhall theory described here, between a Hall cell and the Vinhall sensor, there are several significant equations which will be developed to describe the Vinhall sensor performance. The essential definitive equations in addition to those for sensitivity and channel current developed earlier are those for signal output and signal-to-noise ratio.

From Eq. (37) above, the basic definition for Vinhall sensitivity, the signal response and signal-to-noise ratios can be obtained as follows:

A signal response $\Delta E$ is defined as $R\Delta I$. Therefore, where R is the load resistance and $\Delta I$ is the change in current, I will be equal to the channel current $I_C$ multiplied by the sensitivity $\eta_v$. Therefore, the Vinhall signal output will be as follows:

$$\Delta E = RI_C\eta_v \qquad \text{Eq. (39)}$$

where $I_C$ is the channel current previously derived.

Now, repeating Eq. (16A) and (16B) here for convenience:

$$I_{C_{sat}} = 3D^2 \left(\frac{W}{L}\right) q^2 T \frac{\mu}{2e_S} \left(\frac{L}{L-L_D}\right) \qquad \text{Eq. (16A)}$$

or $$I_{C_{sat}} = 3(N_D T)^2 q^2 T \left(\frac{W}{L}\right) \frac{\mu}{2e_S} \left(\frac{L}{L-L_D}\right) \qquad \text{Eq. (16B)}$$

in which $N_D$ is the donor concentration within the channel, T is the channel thickness, $W_V$ is the Vinhall width, $\underline{V}_{sat}$ is the saturation carrier velocity equal to $10^7$ centimeters/second, and D is the integrated dose density existing in the channel.

From the foregoing, the Vinhall signal response can now be obtained by combining Eqs. (39), (38), and (16A) or (16B) as follows:

$$\Delta E = RI_c\eta_v \qquad \text{Eq. (39)}$$

$$\Delta E = 3/2 RDT^{3/2} \left(\frac{W}{L}\right) q^2 \frac{\mu}{e_S} \sqrt{K_i \frac{D_o}{D_o + D} D} \ V_{sat} dB \quad \text{Eq. (40)}$$

for: $VW_V B \leq KT_o/q$

Eq. (40) is written in terms of dose density D rather than acceptor and donor concentrations $N_A$ and $N_D$, respectively. This is a particularly helpful tool when one is faced with fabricating these devices using either the enhancement mode of operation where carriers are induced to form a channel by the application of a control gate voltage or in the depletion mode of operation where doping or ion implantation techniques are utilized to create a channel in the substrate. Cumulative dose is usually a known variable in such processes and the acceptor and donor concentrations are not so well known or ascertainable.

Before developing an expression for signal-to-noise ratio in the Vinhall sensor, a few words relative to the subject of noise signal itself are appropriate. Besides statistical noise due to fluctuations in electron density or spacing within the conduction channel itself, there are at least three other sources of noise which must be minimized. First, there is injection noise introduced at the source. This is a statistical noise of complex nature produced by variable injection velocities with an essentially gaussian distribution at the source. Suffice it to say that this statistical noise can be minimized by utilizing a relatively long channel, i.e., one that is long compared to the Vinhall width $W_V$.

Another source of noise is surface scattering noise. Surface scattering noise is produced by electrons scattered by surface irregularities at the top surface of the channel. This noise can be reduced or eliminated by creating a buried channel which does not permit significant conduction to occur at the surface of the channel.

A third source of noise is electron trajectory noise. This noise is introduced by rapidly curved electron trajectories which may occur in the vicinity of the drains. This noise source can be reduced or eliminated by making the space between the split drains substantially less than the Vinhall width.

Now, assuming that the steps indicated above for reducing the several sources of noise discussed have all been taken, and considering that the remaining noises which they may exhibit are negligible in comparison to the statistical noise, it may be safely considered that the signal-to-noise ratio is, therefore, the Vinhall output signal divided by the statistical noise which yields the statistical noise ratio $\beta$. $\beta$ for the Vinhall device will now be developed:

$$\beta = \Delta E_V / E_{Noise} = \eta \sqrt{I_C/2 \ \Delta f \ q} \quad \text{Eq. (41)}$$

Where the noise voltage is:

$$\text{Noise Voltage} = R \sqrt{2qI_C \Delta f} = E_{Noise} \quad \text{Eq. (42)}$$

where $\Delta f$ is the signal bandwith in Hertz.

Substituting the expression for channel current $I_C$ of Eq. (16-A) and $\eta$ given by Eq. (38), Eq. (41) may be rewritten as follows:

$$\beta = V_s BT \sqrt{\frac{3/4 \left(\frac{W}{L}\right) q\mu K_i \left(\frac{D_o}{D + D_o}\right) D}{e_S \Delta f}} \quad \text{Eq. (43)}$$

for: $V_s BW_V \leq KT_o/q$

It is evident from Eq. (43) and the definition for $K_i$ above that the signal-to-noise ratio is independent of the Vinhall width $W_V$ once the critical condition $V_s BW_V > KT_o/q$ is reached and depends upon channel thickness T and upon the substrate and channel integrated dose densities $D_o$ and D, respectively, and upon the saturation carrier velocity $V_{sat}$.

Comparison of Vinhall With Hall Devices Using Vinhall Theory:—Next, attention will be directed to comparing the operation of the Vinhall device and a Hall device using the new theory as a basis of comparison. The operating characteristics of a Hall device are developed first utilizing the principles of depletion width modulation discussed above. Before developing the operative equations for the devices, a simple qualitative explanation will be given.

Figure 13A:
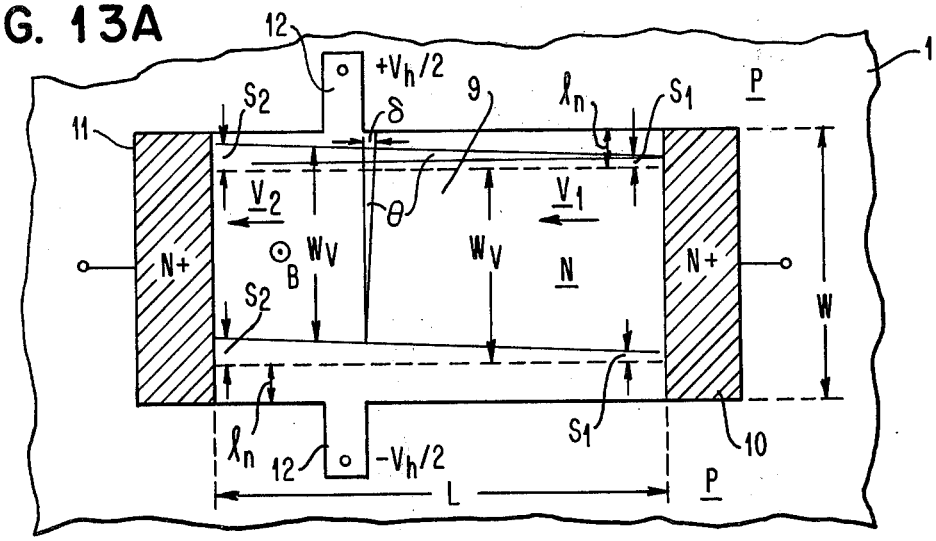
FIGS. 13A and 13B illustrate a typical Hall device and the placement of depletion zones under optimal conditions within such a device. The figures also show the carrier velocity gradient or lack thereof and its effect upon the operation of the devices.
Figure 13B:
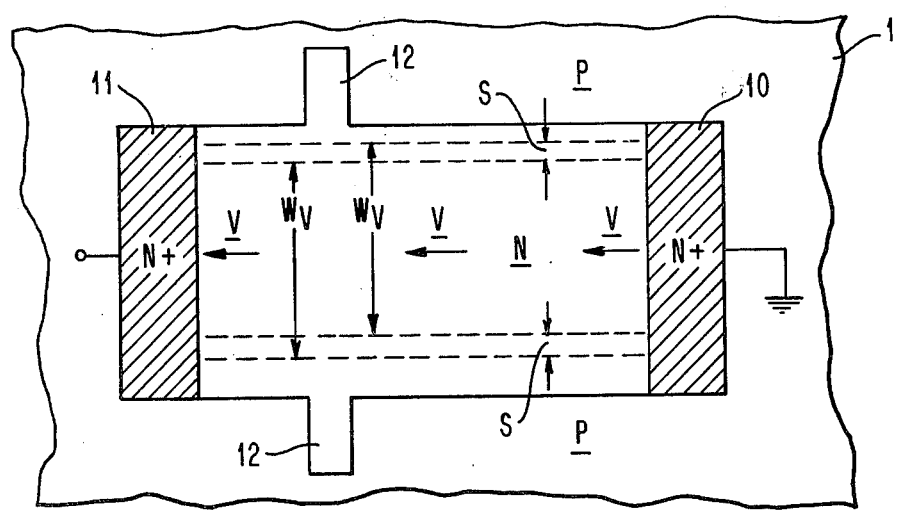

Consider FIGS. 13A and 13B. In FIG. 13A, a enlarged diagrammatic view of a typical Hall cell is shown. Carriers are injected from a source and exit at a drain at the opposite end of the Hall cell. Intermediate to the ends of the Hall cell are two Hall output probes 12. The current moves directly down the channel between the source and the drain and the carriers which enter at the source and enter at a velocity $V_1$ and exit at another velocity $V_2$. A velocity gradient thus exists between the source and the drain and the Hall cell as depicted in FIG. 13A. Due to modulation of the depletion edge boundaries, which are dependent upon the velocity as noted above in Eq. (36), for example, the location of the boundaries will move as shown in FIG. 13A and the equipotential lines will thus be rotated slightly to produce a Hall output voltage at probes 12. It will be noted that the Vinhall width $W_V$ exists in the Hall cell and remains essentially constant.

The dependence of the Hall cell upon a velocity gradient across its dimension will be apparent when FIG. 13B is considered. In FIG. 13B, the Hall cell is shown with similar source, drain, and output probes as shown in FIG. 13A but the entrance and exit velocities $V_1$ and $V_2$ are equal. It may be seen under such circumstances that while the channel boundaries will be moved by depletion zone modulation, they will be moved parallel to the edges of the channel and no rotation of the equipotential lines will take place. Hence, the Hall cell under the circumstances of constant channel velocity will not produce an output signal as defined by the present theory.

Referring to FIG. 13A again, it is evident that the Hall cell will produce an output under the conditions shown since the equipotential lines between the source and the drain have been rotated by a small angle $\theta$. On the other hand there will not be a Hall output signal for the condition shown in FIG. 13B since, in the case therein depicted, the carrier velocity is constant within the channel between the source and the drain. This constant velocity results in a mere translation of the depletion boundaries uniformly along the channel length. The equipotential lines are not altered and consequently no Hall output signal is predicted according to this theory. On the other hand, given the same uniform velocity situation within the channel, the Vinhall device depicted in FIG. 14B will deliver a substantial signal between the slit drains 6 as illustrated. This is because the drains D1 and D2 will experience a differential current as noted above as a result of intercepting substantially all of the translated channel current flowing between the source and the drains.

Figure 14A:
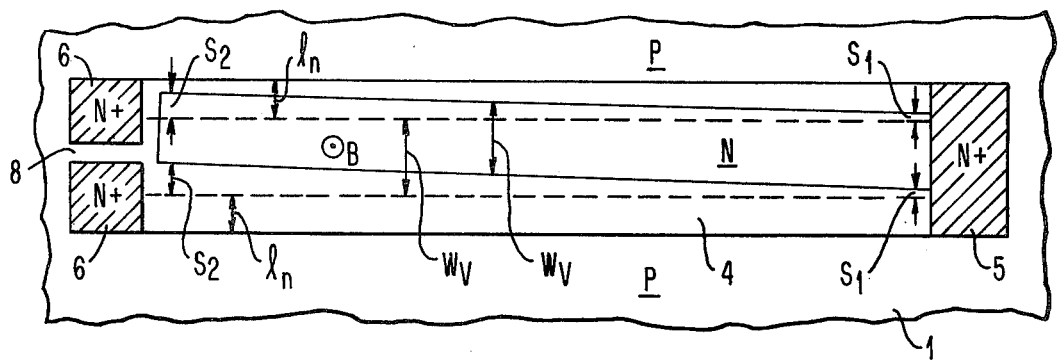
FIGS. 14A and 14B illustrate typical devices constructed according to the invention and show the depletion zone width modulation that occurs with and without carrier velocity gradients, respectively.
Figure 14B:
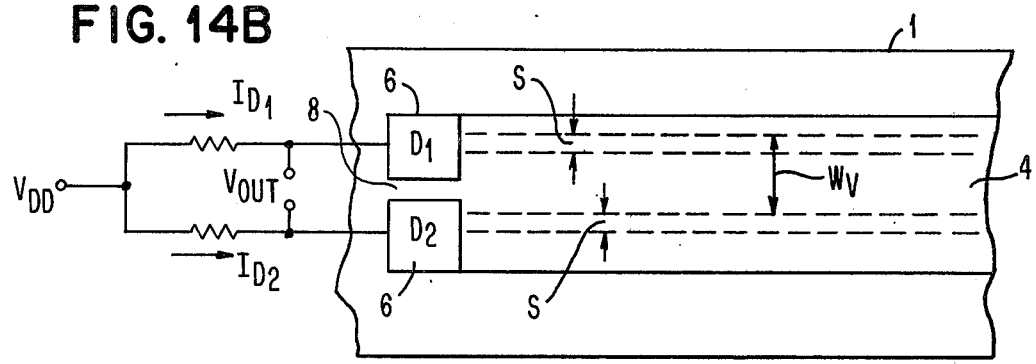
Figure 7A:
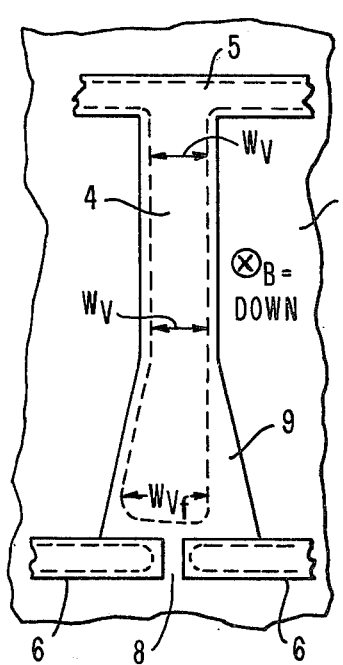
FIGS. 7A through 7C illustrate the effects of depletion width modulation on flared conductive channel sensors according to the invention.
Figure 7B:
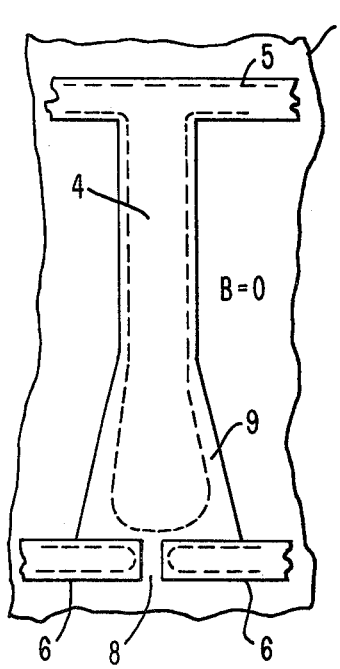
Figure 7C:
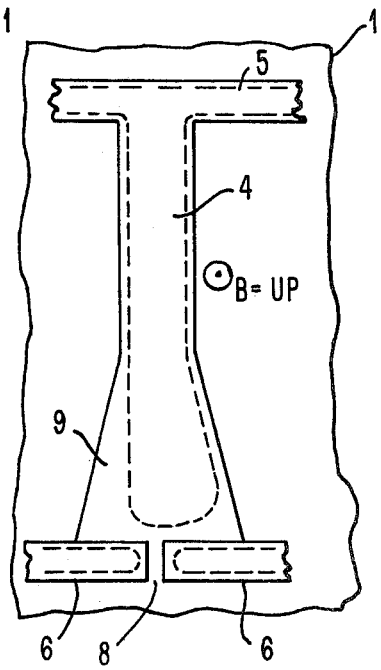

It is apparent from the foregoing brief discussion that the generation of a Hall output voltage depends upon a carrier velocity gradient $\nabla V$ within the channel in order to effect a rotation of the equipotential lines as illustrated in FIG. 13A. The sensitivity of the Hall device under constant velocity conditions is essentially zero but that of the Vinhall sensor for constant velocity conditions can be developed as follows:

Given a Vinhall sensor as shown in FIG. 14B, the sensitivity can be readily calculated by considering the drain currents at the two drains D1 and D2, respectively.

$$A) \; I_{D1} = J\left(\frac{W_V}{2} + S\right) \qquad \text{Eq. (44A)}$$

$$B) \; I_{D2} = J\left(\frac{W_V}{2} - S\right) \qquad \text{Eq. (44B)}$$

$$(C) \; \Delta I = I_{D1} - I_{D2} = 2JS \qquad \text{Eq. (44C)}$$

$$(D) \; I = I_{D1} + I_{D2} = JW_V \qquad \text{Eq. (44D)}$$

where J is current per unit channel width. Therefore:

$$\Delta I/I = I_{D1} - I_{D2}/I_{D1} + I_{D1} = 2S/W_V \qquad \text{Eq. (45)}$$

As noted previously, the generation of a Hall output voltage depends upon a carrier velocity gradient $\nabla V$ existing within the channel. The velocity gradient causes a rotation of the equipotential lines and is apparently a necessary precondition for the production of Hall output voltages. The fundamental differences between a Hall device and a Vinhall device can be easily detected by comparing the operational requirements listed below for both devices.

For a Hall device, in order for operation to result, there must exist the following: (1) a velocity gradient is required within the channel; (2) the output voltage depends upon the carrier velocity and not upon the number of carriers.

For the Vinhall device, operation requires the following: (1) no velocity gradient is necessary; (2) output voltage depends only upon carrier velocity at the drains; and (3) the output voltage depends upon the number of carriers entering the drain regions with a given velocity.

A comparison between the Hall and Vinhall devices based upon their performance and output characteristics can now be developed. The final objective of the analysis is to develop the sensitivity ratio R between the Vinhall and Hall devices. The result of this analysis is independent of the depletion width modulation equation form indicated above since in the analysis, the ratio between the outputs will be utilized and the depletion width modulations are the same in both devices. Carrier velocity will be assumed to increase along the channel in the direction from the source to the drain in order to simplify the analysis and the channel carrier velocity will be given by the following approximation:

$$V(x) = V_1 + (V_2 - V_1)(Y/L) \qquad \text{Eq. (46)}$$

in which $V_1$ is the injection carrier velocity at the source and $V_2$ is the acquired carrier velocity at the drains. The depletion width $l_n$ is modulated at the source by a distance $S_1$ and at the drains by a distance $S_2$ and, in general, at any distance Y along the length of the channel as shown in the equations below wherein:

$$S_1 = \sqrt{K V_1} \qquad \text{Eq. (47A)}$$

$$S_2 = \sqrt{K V_2} \qquad \text{Eq. (47B)}$$

$$S(y) = \sqrt{K(V_1 + (V_2 - V_1)\frac{Y}{L})} \qquad \text{Eq. (48)}$$

where Eq. (47A) shows the displacement at the source, Eq. (47B) shows the displacement at the drain, and Eq. (48) shows the displacement as a function of distance along the channel and in which:

$$K = \frac{e_S}{q} W_V B \frac{N_A}{N_D(N_A + N_D)} \qquad \text{Eq. (49)}$$

For the situation illustrated in FIG. 13A, the small angle $\theta$ is the angle whose tangent is $(S_2 - S_1)/L$. This equals the lateral deflection $\delta$ at one end of an equipotential line divided by the width of the channel W, therefore, equating expressions:

$$\text{Tan } \theta = (S_2 - S_1)/L = \delta/W_V, \text{ or } \delta = W_V/L (S_2 - S_1) \qquad \text{Eq. (50)}$$

As a first order approximation to the Hall voltage $V_h$, one may consider the following in which the rotation of equipotential lines is given by Eq. (50), so that the Hall output will be that percentage of the source to drain voltage $V_0$ that is produced by offsetting the probes by a distance $\delta$:

$$V_h = V_0 \delta/L, \text{ or } \delta = V_h L/V_0 \qquad \text{Eq. (51)}$$

Equating Eqs. (50) and (51) and solving for the Hall voltage $V_h$, yields the following:

$$V_h = V_0 (W/L^2)(S_2 - S_1) \qquad \text{Eq. (52)}$$

Substituting Eq. (47B) and Eq. (47A) for $S_2$ and $S_1$, Eq. (52) above becomes the following:

$$V_h = V_0 (W_V/L^2)[\sqrt{K V_2} - \sqrt{K V_1}] \qquad \text{Eq. (53)}$$

It is evident from Eq. (53) above that the Hall voltage is predicted to be zero if there is no carrier velocity variation existing within the channel, i.e., $V_h = 0$ if $V_2 = V_1$. Thus, it appears that a velocity gradient is required within the channel for operation of a Hall device. For purpose of comparing the Hall cell with a Vinhall device, the conditions necessary to derive the maximum Hall voltage will be utilized and the resulting output signals compared. This situation can be accomplished by requiring that the injection velocity $V_1$ will be zero in both devices and that the terminal velocity of the carriers will be the maximum velocity $V_2$ corresponding to a pinch-off condition and that a linear velocity increase will occur with distance y along the channel toward the drains. For this assumption, the Hall voltage output becomes:

$$V_h = V_0(W_V/L^2)[\sqrt{K V_2}] \qquad \text{Eq. (54)}$$

The Hall cell sensitivity $\eta_H$ which is $V_h/V_0$, is obtained by dividing Eq. (54) through by $V_0$, the voltage applied between the source and the drain of the Hall cell. This results in the following:

$$\eta_H = V_h/V_0 = (W_V/L^2)\sqrt{K V_2} \qquad \text{Eq. (55)}$$

The Vinhall sensitivity $\eta_V$ is obtained by considering FIG. 13A to correspond to the split drain configuration of FIG. 12 by imagining a slit 8 to exist in FIG. 13A. The Vinhall sensitivity $\eta_V$ becomes the following since the Vinhall sensitivity is defined as before as $2S/W_V$, where $S = S_1 + \Delta S$ and where $\Delta S = S_2 - S_1$, where $S_1$ and $S_2$ are as given in Eqs. (47A) and (47B);

$$\eta_V = 2S_1/W_V + 2\Delta S/W_V = 2S_2/W_V = 2/W_V \sqrt{K V_2} \qquad \text{Eq. (56)}$$

The sensitivity ratio R which is defined to compare the Vinhall cell output with the Hall cell output is achieved by dividing Eq. (56) by Eq. (55) and yielding the following:

$$R = 2(L/W_V)^2 = \eta_V/\eta_H \qquad \text{Eq. (57)}$$

Eq. (57) above is valid for the equivalent conditions of operation of the two devices where a voltage $V_0$ equal to one half the channel current times the load resistance $R_L$ is dropped across the Vinhall load resistor $R_L$ which will create a voltage $V_0$ identical to the driving voltage $V_0$ applied across the Hall cell.

It may be seen that $V_{Sat} = \frac{1}{2}(I_{CSat}R_L)$ but $I_{CSat} = V_{Sat}D[(W_V/L)q\mu]$. Thus by substituting the expression for $I_{CSat}$, $L/W_V = R_L D q \mu/2$. This criteria specifies that the length to Vinhall width ratio is a function of load resistance, channel dose, charge and channel carrier mobility. It is preferred that this criteria be the minimum $L/W_V$ ratio used for optimum results.

It is evident from Eq. (57) that the sensitivity of the Vinhall sensor far exceeds that of the Hall cell. The increase in sensitivity in the Vinhall sensor depends upon the square of the ratio of the channel length L to the Vinhall width $W_V$. The optimum length-to-width ratio for a Hall device has been reported to be close to unity and that for a Vinhall device L/W is somewhere in the area greater than five. Thus, assuming an average Hall cell $L/W \approx 3$, the least sensitive Vinhall sensor will still be at least twenty times more sensitive than the most sensitive equivalent Hall cell.

PREFERRED EMBODIMENTS

Figure 2:
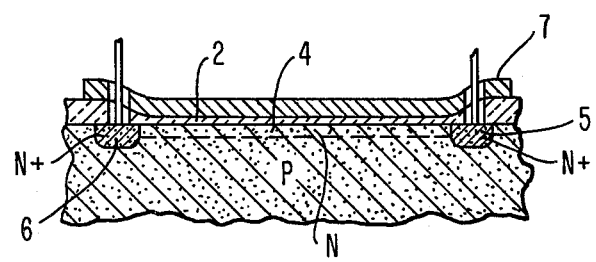
FIG. 2 illustrates a typical longitudinal cross-section along the lines AA in FIG. 1 for the type of channel which can be created by enhancement, i.e., by the placement of a suitable voltage on a control gate to induce the presence of charge carriers into a channel region for conduction in the surface of the substrate.

Turning now to a brief consideration of enhancement mode channel conduction devices, attention will be turned to FIGS. 1 and 2. In FIG. 2 a longitudinal cross section of the device shown in FIG. 1 is illustrated in which a semiconductive metal substrate 1 has implanted in it or diffused in it a source 5 and one or more drains 6. The surface of the substrate particularly in the vicinity of the channel 1 is overlain by a thin insulating oxide layer 2 well known in the art and an evaporated or otherwise deposited aluminum metal or other conductive material which forms a gate 7 to which suitable control voltages may be applied.

As is well understood by those of skill in the art, this constitutes a field effect transistor channel structure in which, with suitable voltages on the control gate 7, the source and drains 5 and 6, respectively, a conduction channel 4 of carriers called an "inversion layer" will be induced to form between the source 5 and drains 6. This has the effect of creating an effective carrier dose density which is definable in the same sort of terms as were used previously for an implanted channel device in which the carriers or ions necessary to form the channel are implanted below the substrate surface. It may be shown that the signal output of the enhancement mode device in which carriers are induced to form a conductive channel is linear with gate voltage and less sensitive than a buried (depletion mode) channel device. The loss in sensitivity and output is a result of a thin channel thickness T and a high equivalent channel donor concentration $N_D$. The latter diminishes the amount of depletion width modulation that may be achieved along the channel boundaries for a given Lorentz field.

The equations described above show that the Vinhall sensor has performance properties stated in terms of dose among other parameters. Enhancement mode Vinhall configurations do not have an implanted dose as such, but do have an equivalent dose in the inverted charge layer created by the gate electrode and by the thin oxide layer which separates the gate electrode from the surface of the silicon substrate. Assuming that the concentration $N_D$ of carriers which are inverted to the surface of the channel is uniform within a thickness layer T of about 1000Å, an equivalent induced dose density D can be derived by considering the boundary conditions for the dielectric field at the surface of the semiconductor produced by action of the gate voltage acting across the thin oxide layer toward the silicon substrate. The relationship between the effective dose $\bar{D}$ and the gate voltage $V_g$ is given by Eq. (58) as follows:

$$\bar{D} = V_g C_o/2q \qquad \text{Eq. (58)}$$

where $C_o$ is the gate capacitance per centimeter squared and is equal to the dielectric constant e divided by the thickness of the oxide layer $t_0$.

By substituting the expression that shows the effective dose $\bar{D}$ in Eq. (58) for the implanted dose density in the Vinhall depletion mode equations given earlier, one may obtain the equivalent expression for the enhancement mode devices. It is important to note that the operation of the Vinhall devices as embodied in either the enhancement or the depletion mode follows an identical mechanism.

Figure 4:
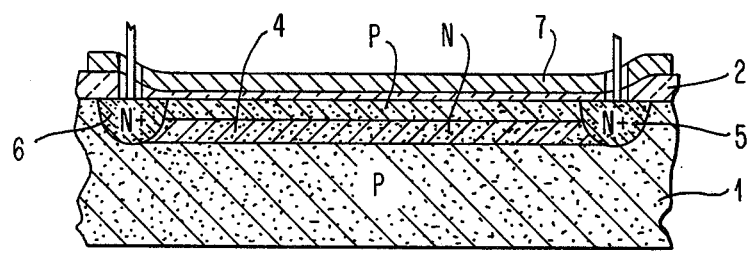
FIG. 4 illustrates a transverse sectional view of a deeply implanted or buried conduction channel device of the filamentary type of the present invention.

FIG. 4 illustrates in logitudinal cross section a typical semiconductor substrate 15 having a channel 4 buried beneath the surface of the substrate and having the following characteristics:

The channel 4 is created by implanting phosphorus, for example, in such a manner that a deep and uniform carrier concentration is developed below the substrate surface and extending to a depth of approximately 4,000Å units or more. A typical cumulative dose or fluence that is desired is approximately $2 \times 10^{12}$ ions/centimeter squared during the implantation process. It is most desirable that this fluence be implanted consecutively with energies ranging from 50 KEV to 200 KEV.

A deep channel with thickness T in the 4,000Å range is, therefore, produced beginning at approximately 500Å below the surface of the substrate. Such a channel is desired for achieving the necessary channel current while allowing substantial depletion width modulation along the sides of the channel to occur. As noted above, in derivation of the equations, it is also important to bury the channel at some significant depth below the surface of the semiconductive substrate to reduce noise conditions to enhance the signal-to-noise ratio. The control gate 7 serves as an electrical shield to reduce noise but is not needed to control the channel conduction.

Figure 5:
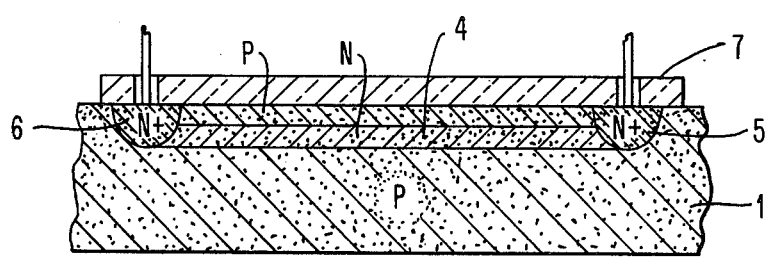
FIG. 5 illustrates an alternative embodiment of the structure similar to that shown in FIG. 4.

FIG. 5 illustrates an alternative embodiment to that shown in FIG. 4 in which the metal control gate 7 has been entirely removed and an opaque insulator 16 is shown above the top surface. The purpose of opaque insulator layer 16 is to prevent light entering the semiconductor substrate and causing noise due to photon energy ejection of electrons in the channel.

FIGS. 3C and 3D and FIGS. 7A through 7C illustrate flared channel Vinhall sensor structures. There are several reasons for flaring the channel. First, as noted above, the width of the straight channel portion close to the source controls the channel current that passes through the device. The channel current thus controlled is virtually independent of events taking place farther downstream within the flared region closer to the drains. By this means, the statistical noise due to source injection conditions and the effects of drain area depletion length modulation are minimized and the device stability is improved.

Figure 3A:
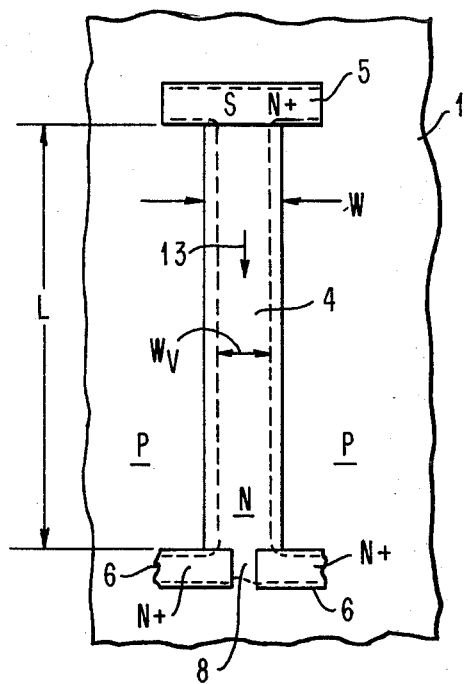
FIGS. 3A through 3D illustrate top or plan schematic views of two multi drain single source filamentary channel conduction devices and the effects of pinch-off on the depletion boundaries and Vinhall widths.
Figure 3B:
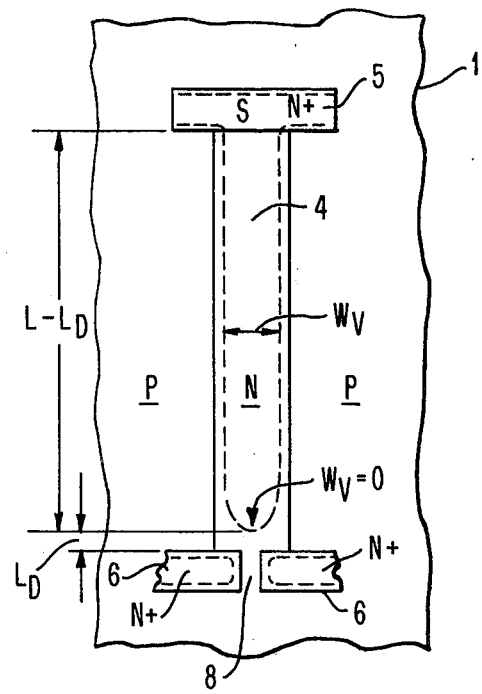
Figure 3C:
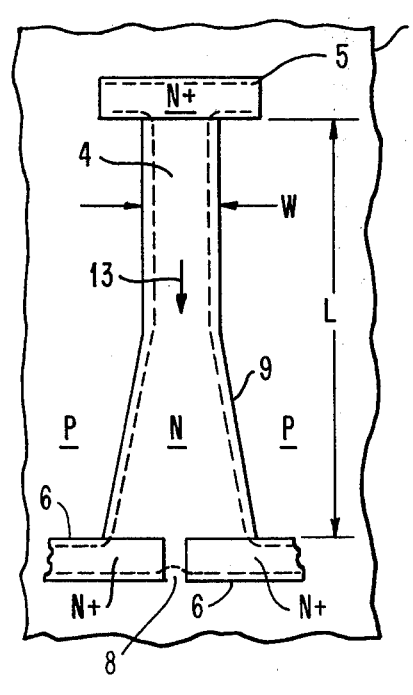

Secondly, flaring the channel is necessary in order to accommodate the increasing depletion width modulations that occur at positions along the channel sides closer to the drain regions. The increase in depletion width modulation is a result of the drain voltage increasing with distance from the source (as one approaches the drains). If the narrow channel were not flared, the channel would become pinched off as shown in FIG. 3B in the width direction close to the drains, causing the Vinhall width to become zero. If this were to occur, no Lorentz deflection of any depletion boundary could occur since the Lorentz voltage $\underline{V}BW_V$ would be zero. Flaring the channel prevents the width modulation effects from actually pinching off the total Vinhall width. This is the situation illustrated in FIG. 3D at the point where the longitudinal pinch-off occurs at $(L - L_D)$ within the channel adjacent to the drains.

Figure 3D:
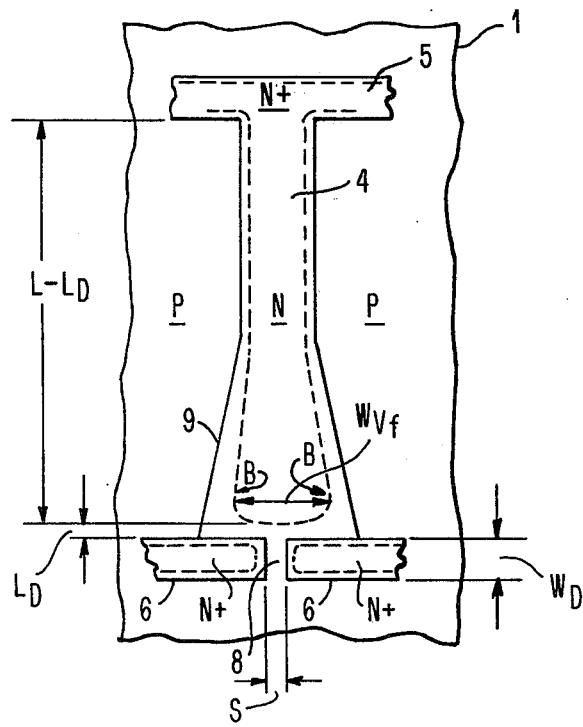

The flared Vinhall width $W_{Vf}$ desired in the vicinity of the drains is governed by the width S of the slit 8 in FIG. 3D which separates the drain regions. The flared Vinhall width defined as $W_{Vf}$ should be at least equal to the slit width S.

The most sensitive region of the Vinhall device is in the vicinity of the drains and is the only region requiring a magnetic field in order to modulate the depletion boundaries labeled B in FIG. 3D. This feature of the Vinhall sensor not only accounts for its high resolution, but also for its high sensitivity. Thus, the Vinhall sensor acts as essentially a point sensor. It is preferred, although not required for operation, that the Vinhall device be operated in the pinch-off mode. Such a situation is illustrated in FIG. 7A through FIG. 7C and FIG. 3D.

If the Vinhall device is operated below the pinch-off voltage (see FIG. 9), it is desired that the width $W_d$ of the drains 6 shown in FIG. 3D be less than or equal to the width S of the slit 8. Otherwise, the conductance between the drains 6 will excessively attenuate the differential signal response measured between the drains.

A narrow slit S between drains 6 is desired to achieve the best Vinhall device sensitivity. Special fabrication techniques may be employed to achieve a narrower slit width. One method is to implant the two drain contact regions 6 as close together as the photolithographic mask techniques will permit and then to follow with a post diffusion annealing operation which permits limited ion migration at a critical annealing temperature near the diffusion temperature. This is approximately 1000° C. for silicon, but, as is known in the art, varies for different materials. The result of this operation is a slit width which is less than the minimum mask width that can be generated in the photolithographic technique. A second technique for making a narrower slit is to implant a continuous drain region initially without a slit. An effective slit may then be formed by using electron beam technology to provide a very narrow slit mask. Ions of the material opposite to the type in the slit area already may then be implanted so as to create an electrical separation between two regions of the drain. The opposite material type implanted forms an effective slit which neutralizes the initial implant in this region. In this manner, the slit region can be made to be intrinsic in resistivity or the same type material as the channel. The separate drain members thus formed are highly doped to prevent their depletion at high drain voltage conditions.

Having thus described the invention with relation to several preferred embodiments thereof, it will now be interesting to compare the typical filamentary form of a Vinhall device with some of the known prior art devices. The filamentary form of the Vinhall device is defined by the ratio of Vinhall width $W_V$ to the total channel width W. Eq. (25) will be the starting point for this analysis. In Eq. (25) the width of the depletion zone inside a channel at one wall of the channel is described with relation to several variables. Assuming the most optimum values for the variables as follows:

$e_S = 1.04 \times 10^{-12}$
$q = 1.6 \times 10^{-19}$
$N_A = N_D = 10^{17}$ and
$\psi$ (as defined by Eq. (24) = $4 \times 10^{-1}$ for these assumptions.

With the foregoing assumptions, the width of the depletion layer near the source in a Vinhall device [at which the V term for Eq. (25) is zero] is approximately 510Å. The total depleted area is twice this value or approximately 1000Å and, assuming the worst case, i.e., a wide channel Vinhall device, with a channel width of 0.2 mil or 50,000Å, the ratio $W_V$ divided by W is equal to 0.98. If a more appropriate total channel width of 0.1 mil, i.e., 25,000Å is chosen, the ratio becomes 0.96.

The foregoing assumes the worst case for a Vinhall device in terms of width and the best case in terms of depletion zone widths that can be imagined. By comparison, taking some known prior art devices at their best possible conditions yields the following.

Consider a typical Hall device of the smallest dimensions contemplated, approximately 1 mil square, the Vinhall width to channel width ratio in the vicinity of the source is approximately 0.999. Making the Hall device wider or longer will only serve to force the ratio closer to 1.0 since the depletion zone width as defined in Eq. (25) is not a function of channel width.

Considering the nature of the prior art device in the IBM TDB, Volume 13, No. 12, May 1971, page 3633, and taking its teaching in light of the best known physical dimensions under which it could be constructed yields a Vinhall width to channel width ratio in the vicinity of the source of 0.998. This is based on the assumption that the drains in the article would be constructed at the smallest dimension or approximately 0.2 mil wide and that the source, as viewed in the drawing of the TDB would be approximately 0.8 mils wide in proportion to the drains.

Considering the device in the IBM TDB, Volume 14, No. 11, April 1972, page 3420, and taking the teachings as being at the limit of the best known technology, yields a Vinhall width to channel width ratio in the vicinity of the source of approximately 0.998 assuming that the drains as shown in the article are approximately 0.6 mils wide and that the gap between the drains is the approximate narrowest limit of resolution for the type of technology shown of 0.2 mils.

The foregoing analysis shows that the best known prior art taken in light of its most favorable assumed teachings results, in Vinhall width to channel width ratios in excess of 0.98 while the Vinhall device, taken in its worst light and under the worst conditions, yields a Vinhall width to channel width ratio at a maximum of 0.98 in the vicinity of the source. The point of the analysis is to show that the preferred Vinhall device has a Vinhall width to channel width ratio which is less than 0.98 and greater than 0. This is another way of stating that the depletion zones form a substantial portion of the conduction channel. This is a radical departure from the course taken in the prior art and may only be achieved when a proper understanding of the depletion zone width characteristics is reached in conjunction with the realization that the channel width should be made as small as possible.

Having thus described my invention with relationship to its theory of operation and with regard to several preferred embodiments thereof, it will be understood by those of skill in the art that many departures from the specific dimensions and technology utilized in constructing the preferred embodiments may occur without violating the basic teachings and principles of the invention as described and which is desired to protect by letters patent in the claims as follows:

1. In a semiconductive, channel conduction, field sensor device having a substrate of semiconductive material, a source region and at least two separated drain regions in said substrate and a conductive channel in said substrate connecting said source and said drains, the improvement comprising:
    said channel of conducting material having a filamentary form defined by having a Vinhall width to channel width ratio in the vicinity of said source that is greater than 0 and less than 0.98.

2. In a device as described in claim 1, the improvement further comprising:
    the distance between said source and said drains divided by said Vinhall width is greater than one-half of the value defined by the load resistance multiplied by the channel charrier density and by the channel carrier mobility and the electron unit charge.

3. In a device as described in claim 1, the improvement further comprising:
    the ratio of the Vinhall width of said channel in the vicinity of said drains to the Vinhall width of said channel at said source is greater than 1.

4. In a device as described in claim 1, the improvement further comprising:
    the ratio of the Vinhall width of said channel at a point along said channel intermediate said source and said drains to the Vinhall width of said channel at said drains is greater than 1; and
    the ratio of said width at said intermediate point along said channel to said Vinhall width at said source is equal to one.

5. In a device as described in claim 1, the improvement further comprising:
    said separation between said drains is less than said Vinhall width.

6. In a device as described in claim 1, the improvement further comprising:
    said drains have a dimension taken parallel to the center of said channel which is less than equal to the distance separating said drains from one another.

7. In a device as described in claim 1, the improvement further comprising:
    said channel lying beneath the surface of said substrate and being separated therefrom by a layer of material of opposite conductivity to said channel and being separated from the surface of said substrate by a distance which is less than said Vinhall width.

8. In a device as described in claim 1, the improvement further comprising:
    the Vinhall width of said channel is greater than the thickness of said channel in the direction perpendicular to the surface of said substrate.

9. In a device as described in claim 1, the improvement further comprising:
    said Vinhall width in the vicinity of said drains is greater than 0 and less than a quantity $(2KT/q) V_S B$.

10. In a device as described in claim 1, the improvement further comprising:
    voltage means applied to said source and said drains of sufficient magnitude to pinch off said conductive channel in the vicinity of said drains.

* * * * *